(12) United States Patent
Kondo

(10) Patent No.: US 7,251,385 B2
(45) Date of Patent: Jul. 31, 2007

(54) WAVELENGTH MULTIPLEXING ON-CHIP OPTICAL INTERCONNECTION CIRCUIT, ELECTRO-OPTICAL DEVICE, AND ELECTRONIC APPARATUS

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 228 days.

(21) Appl. No.: 10/722,431

(22) Filed: Nov. 28, 2003

(65) Prior Publication Data

US 2004/0136715 A1 Jul. 15, 2004

(30) Foreign Application Priority Data

Dec. 6, 2002 (JP) .............................. 2002-355348

(51) Int. Cl.
*G02B 6/12* (2006.01)
*H01L 29/00* (2006.01)

(52) U.S. Cl. ........................... 385/14; 385/24; 257/499

(58) Field of Classification Search ................. 385/24, 385/14

See application file for complete search history.

(56) References Cited

U.S. PATENT DOCUMENTS

| | | | | |
|---|---|---|---|---|
| 5,093,879 A | * | 3/1992 | Bregman et al. | ............. 385/93 |
| 5,448,661 A | * | 9/1995 | Takai et al. | ............. 385/24 |
| 5,537,238 A | * | 7/1996 | Janniello et al. | ............. 398/93 |
| 5,793,909 A | * | 8/1998 | Leone et al. | ............. 385/24 |
| 6,038,357 A | * | 3/2000 | Pan | ............. 385/24 |
| 6,205,268 B1 | * | 3/2001 | Chraplyvy et al. | ............. 385/24 |
| 6,393,183 B1 | * | 5/2002 | Worley | ............. 385/39 |
| 6,430,325 B1 | * | 8/2002 | Shimoda | ............. 385/14 |
| 6,735,731 B2 | * | 5/2004 | Ewen et al. | ............. 714/733 |
| 6,816,642 B1 | * | 11/2004 | Mayer et al. | ............. 385/24 |
| 6,839,481 B2 | * | 1/2005 | White | ............. 385/24 |
| 6,845,184 B1 | | 1/2005 | Yoshimura et al. | |
| 6,952,504 B2 | * | 10/2005 | Bi et al. | ............. 385/9 |
| 2001/0021287 A1 | * | 9/2001 | Jewell et al. | ............. 385/14 |
| 2003/0026517 A1 | * | 2/2003 | Shimoda | ............. 385/14 |
| 2003/0152391 A1 | * | 8/2003 | Kuhara et al. | ............. 398/164 |
| 2004/0081402 A1 | * | 4/2004 | Ouchi | ............. 385/40 |
| 2004/0131304 A1 | * | 7/2004 | Kondo | ............. 385/14 |
| 2004/0136639 A1 | * | 7/2004 | Kondo | ............. 385/14 |
| 2004/0218848 A1 | * | 11/2004 | Shen et al. | ............. 385/14 |
| 2004/0264867 A1 | * | 12/2004 | Kondo | ............. 385/49 |
| 2005/0111781 A1 | * | 5/2005 | Jain et al. | ............. 385/15 |
| 2005/0185880 A1 | * | 8/2005 | Asai | ............. 385/14 |

FOREIGN PATENT DOCUMENTS

| | | |
|---|---|---|
| EP | 0 041 668 A2 | 12/1981 |
| JP | A-57-24832 | 2/1982 |
| JP | U 60-137458 | 9/1985 |

(Continued)

Primary Examiner—Michelle Connelly-Cushwa
Assistant Examiner—Rhonda S. Peace
(74) Attorney, Agent, or Firm—Oliff & Berridge PLC

(57) ABSTRACT

To provide a wavelength multiplexing on-chip optical interconnection circuit, an electro-optical device, and an electronic apparatus, wherein a signal transmission speed can be enhanced, fineness can be easily accomplished, and they can be simply manufactured, the wavelength multiplexing on-chip optical interconnection circuit includes a plurality of circuit blocks provided on one integrated circuit chip; and an optical waveguide provided on the integrated circuit chip, as a transmission line to transmit a plurality of light components having different wavelengths λ1 and λ2 between the circuit blocks.

13 Claims, 22 Drawing Sheets

FOREIGN PATENT DOCUMENTS

| | | |
|---|---|---|
| JP | A 61-121014 | 6/1986 |
| JP | A 63-33709 | 2/1988 |
| JP | A-3-268523 | 11/1991 |
| JP | A 5-13749 | 1/1993 |
| JP | A 5-297234 | 11/1993 |
| JP | A 6-232126 | 8/1994 |
| JP | A 11-154907 | 6/1999 |
| JP | A 2000-56725 | 2/2000 |
| JP | A 2000-114581 | 4/2000 |
| JP | A 2001-42150 | 2/2001 |
| JP | A 2001-141965 | 5/2001 |
| JP | A 2002-26397 | 1/2002 |

* cited by examiner

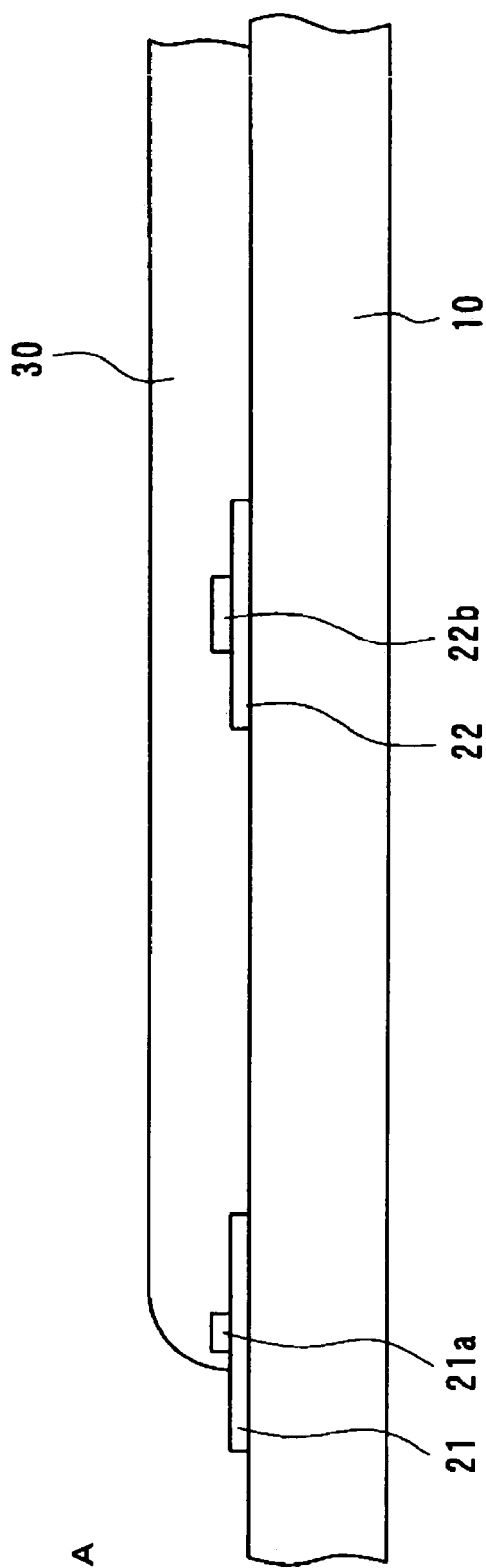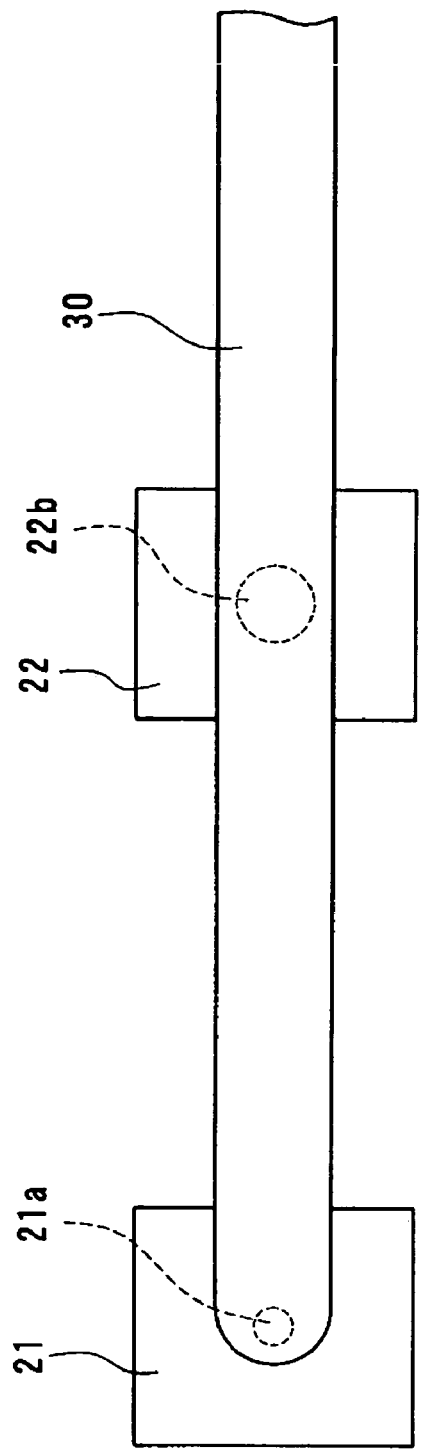
FIG. 2A
FIG. 2B

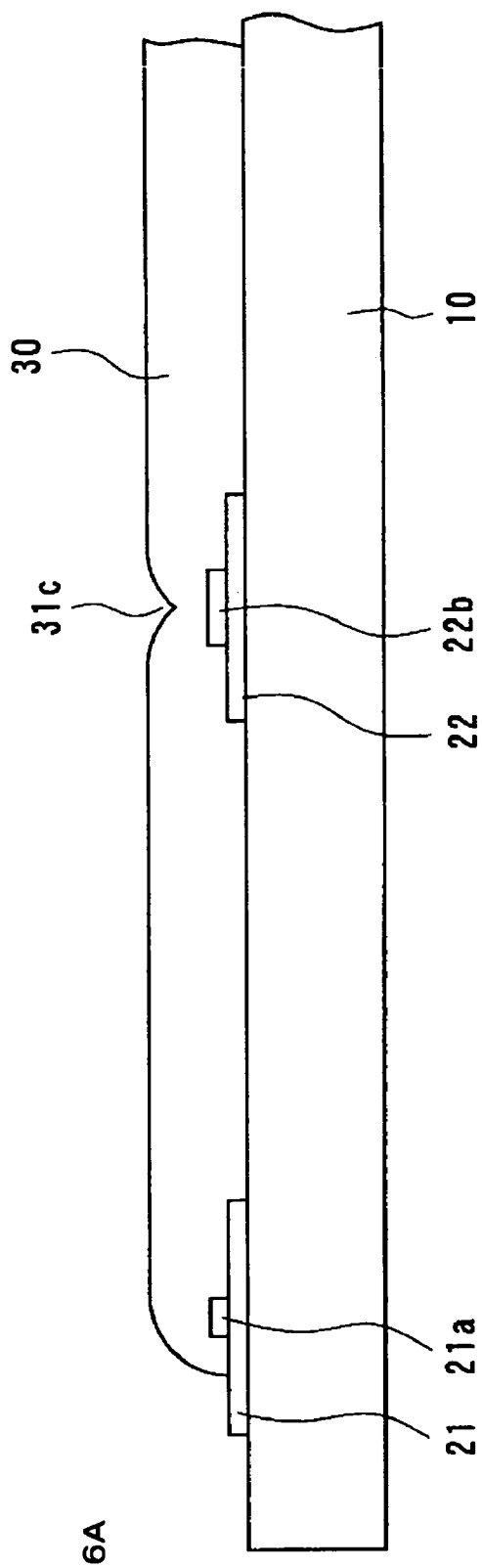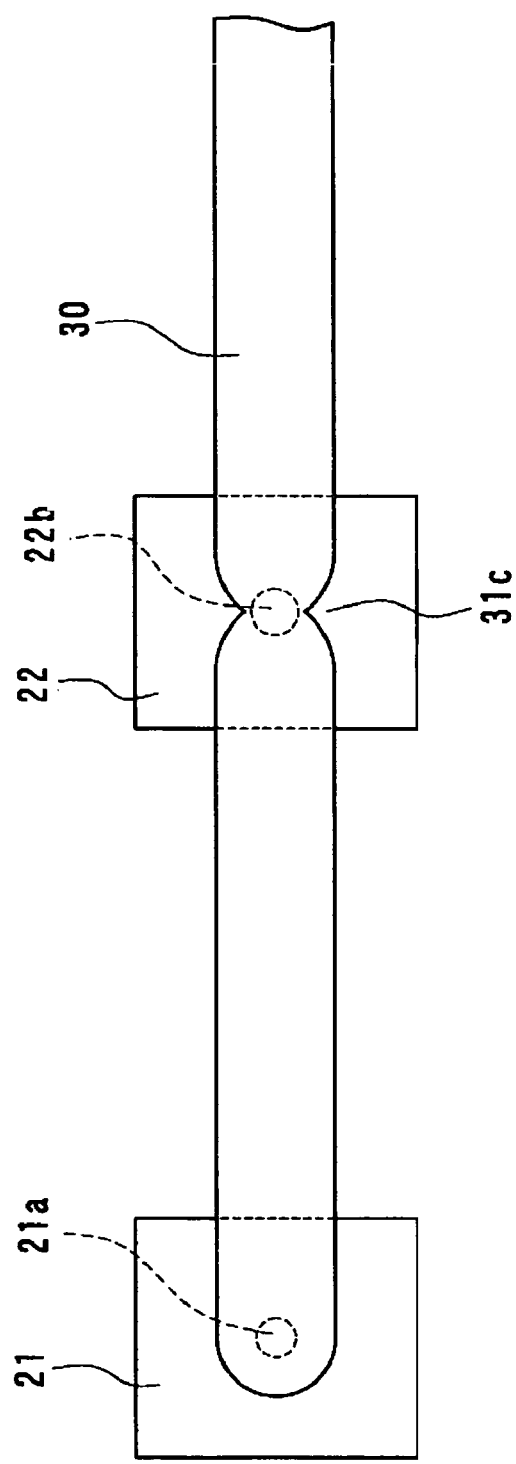
FIG. 6A
FIG. 6B

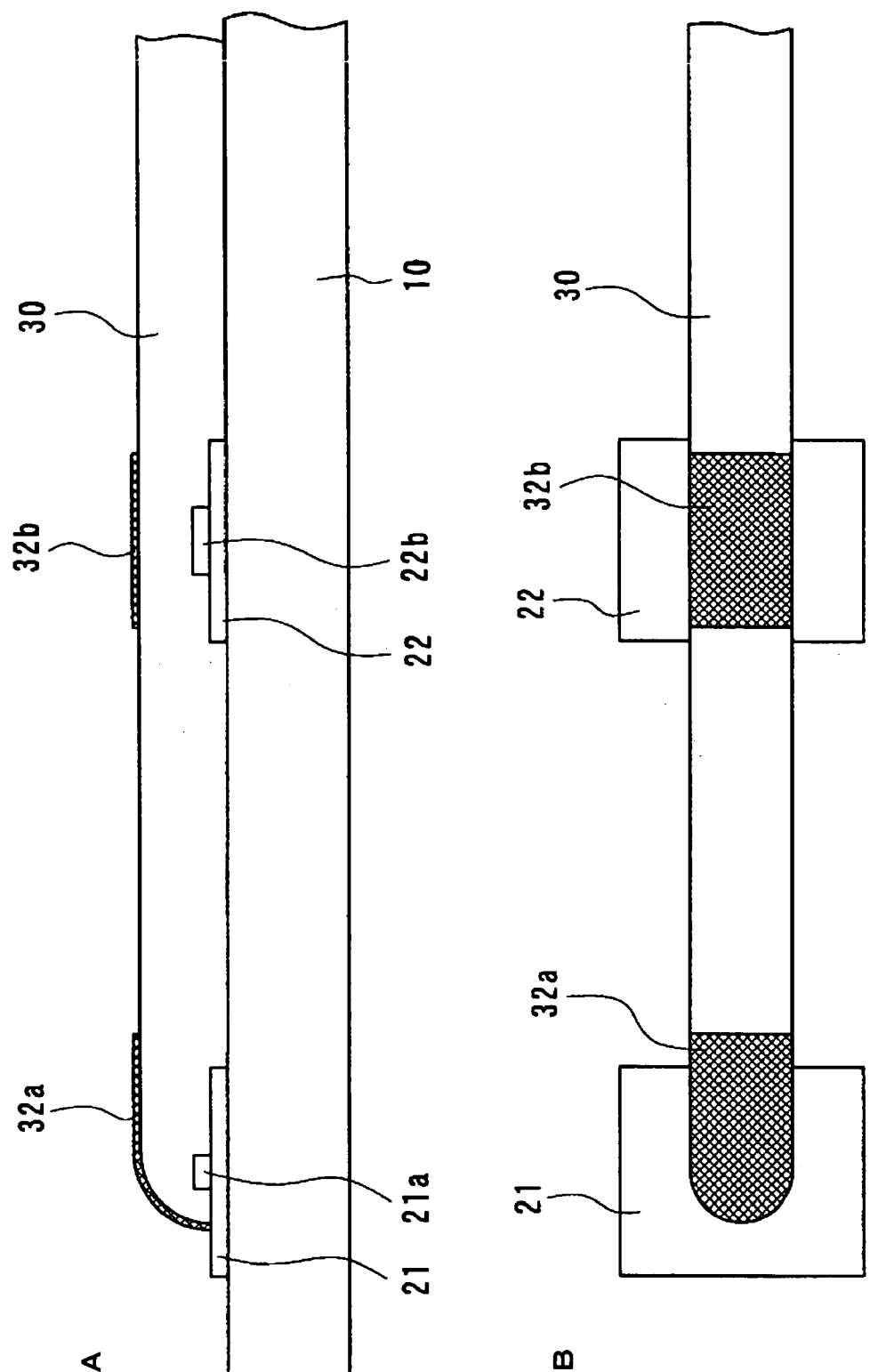

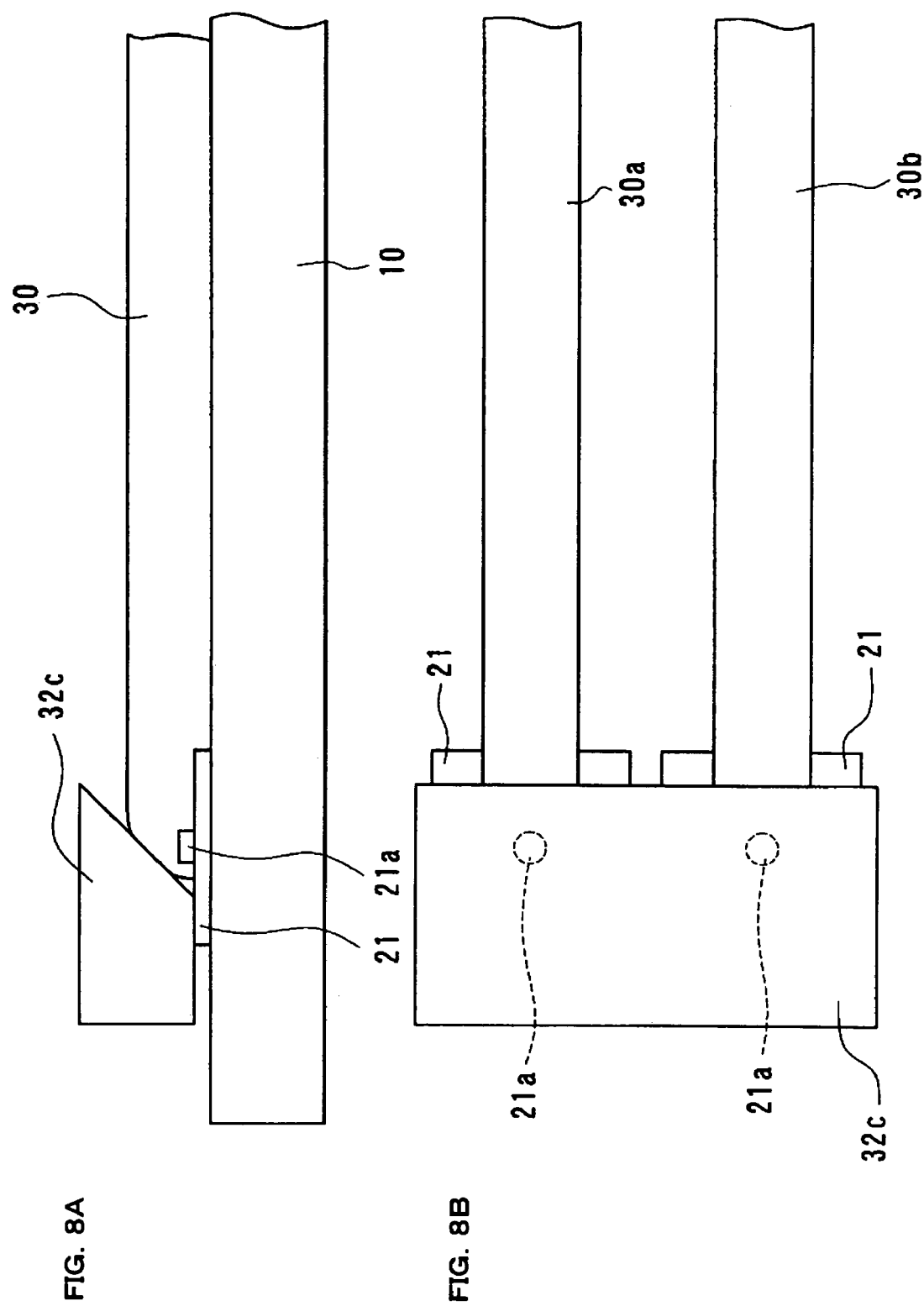

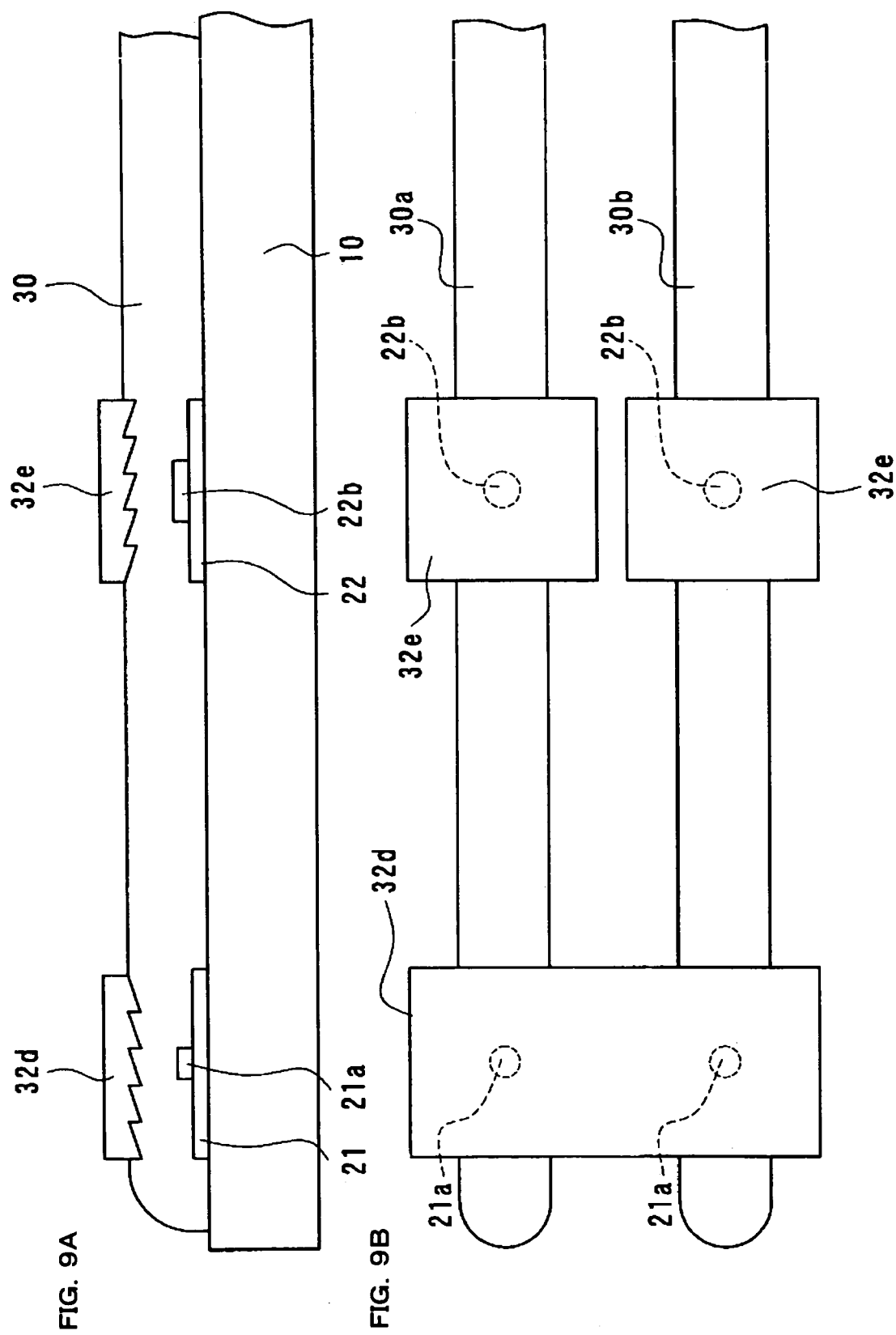

WAVELENGTH MULTIPLEXING ON-CHIP OPTICAL INTERCONNECTION CIRCUIT, ELECTRO-OPTICAL DEVICE, AND ELECTRONIC APPARATUS

BACKGROUND OF THE INVENTION

1. Field of Invention

The present invention relates to a wavelength multiplexing on-chip interconnection circuit, an electro-optical device, and an electronic apparatus.

2. Description of Related Art

LSIs (Large Scale Integrated circuits) have progressed as integrated circuits having specific functions, such as DRAM (Dynamic Random Access Memory) or MPU (Micro Processing Unit), but with the speedup of MPUs, SRAMs (Static Random Access Memories), used as high-speed cache memories, there has been increased integration on the same chip. Now, by integrating flash memory, DSP (Digital Signal Processor), DRAM, etc. on one chip, the LSIs are being developed into high-performance information processing systems.

The LSI obtained by forming the integrated circuits having different functions on the same chip as described above is referred to as SOC (System On a Chip). In the SOC, the integrated circuits (circuit blocks) having different functions are two-dimensionally formed on one chip, and the respective circuit blocks are connected to each other through electrical wiring, referred to as global wiring. An operating speed of the SOC is restricted by problems, such as the signal delay or the increase in power consumption of the global wiring.

If signal transmission between the respective circuit blocks can be performed using optical signals, the signal delay or the increase in power consumption generated in the electrical global wiring can be reduced or avoided, thereby remarkably enhancing the processing speed of LSI.

Then, in order to transmit data using the optical signals, optical transmission devices for transmitting the optical signals emitted from a light source to a predetermined place and inputting the optical signals to light receiving elements, etc. are required. In the related art, optical fibers or optical waveguides formed on a substrate were used as optical transmission devices.

However, when the optical fiber is used as an optical transmission device, connection to optical components, such as a light emitting element and a light receiving element is complicated. There are problems that manufacturing is expensive and time consuming and miniaturization of the optical transmission device is difficult.

It can be considered that the connection of an optical transmission medium to the light emitting element and the light receiving element is simplified using an optical waveguide formed on a substrate. However, input/output structures suitable for the optical waveguide are not available, and the optical transmission device with fineness and facilitation of manufacture enough to apply to the integrated circuits is not developed yet.

SUMMARY OF THE INVENTION

The present invention has been made to address the above situations. It is an advantage of an aspect of the present invention to provide a wavelength multiplexing on-chip optical interconnection circuit, an electro-optical device, and an electronic apparatus, wherein a signal transmission speed can be enhanced, fineness can be easily accomplished is simplified.

In order to accomplish the above advantage, a wavelength multiplexing on-chip optical interconnection circuit according to an aspect of the present invention includes a plurality of circuit blocks provided on one integrated circuit chip, and an optical waveguide provided on the integrated circuit chip as a transmission line to transmit a plurality of light components having different wavelengths between the circuit blocks.

According to an aspect of the present invention, data can be transmitted at a very high speed between the circuit blocks provided on one integrated circuit chip (an IC chip or an LSI chip) using optical signals (optical pulse signals, etc.) to be propagated through the optical waveguide. Further, according to an aspect of the present invention, since the optical signals having different wavelengths are transmitted through one optical waveguide, data can be transmitted at a higher speed with a compact structure. Therefore, according to an aspect of the present invention, by constructing, for example, CPU and a memory unit, etc as the circuit blocks, it is possible to enhance the signal transmission speed between CPU and the memory unit, which was a bottleneck in the related art computer system.

In the wavelength multiplexing on-chip optical interconnection circuit according to an aspect of the present invention, it is preferable that the circuit blocks are optically and electrically connected to each other.

According to an aspect of the present invention, the circuit blocks can be optically connected to each other using the optical waveguide, and can be electrically connected to each other using metal wiring lines. As a result, signals and power supply, not requiring a relative high-speed transmission, can be electrically transmitted through the metal wiring lines, and signals requiring a high-speed transmission can be transmitted through the optical waveguide. Therefore, according to an aspect of the present invention, it is possible to provide a system having a simple and compact structure and capable of processing signals at a high speed as a whole.

Further, in the wavelength multiplexing on-chip optical interconnection circuit according to an aspect of the present invention, it is preferable that at least a part of the optical waveguide is provided on top surfaces of the circuit blocks.

According to an aspect of the present invention, for example, a light emitting element or a light receiving element provided on the top surfaces of the circuit blocks can be optically connected to the optical waveguide. Therefore, according to an aspect of the present invention, it is possible to enhance the degree of freedom in arrangement of the optical waveguide, the light emitting element and the light receiving element, so that it is possible to provide the wavelength multiplexing on-chip optical interconnection circuit having a simple and easily-manufactured structure.

Furthermore, in the wavelength multiplexing on-chip optical interconnection circuit according to an aspect of the present invention, it is also preferable that at least a part of the optical waveguide is provided on the circuit blocks to traverse the circuit blocks.

According to an aspect of the present invention, since the optical waveguide can be arranged in any region as well as the top surfaces of the circuit blocks, on the integrated circuit chip, it is possible to reduce the length of the optical waveguide.

Furthermore, in the wavelength multiplexing on-chip optical interconnection circuit according to an aspect of the present invention, it is also preferable that at least a part of the optical waveguide is provided to detour around the circuit blocks.

According to an aspect of the present invention, for example, when a relatively large step difference is formed at the boundary between the circuit block regions and the non-circuit block region on the integrated circuit chip, it is possible to enhance optical coupling efficiency in the optical waveguide, by providing the optical waveguide to detour around the circuit block regions.

Furthermore, in the wavelength multiplexing on-chip optical interconnection circuit according to an aspect of the present invention, it is preferable that a light emitting element or a light receiving element is electrically connected to each of the circuit blocks, the light emitting element emits a light component having a predetermined wavelength into the optical waveguide, and the light receiving element receives a light component having a predetermined wavelength from the optical waveguide.

According to an aspect of the present invention, output signals of the circuit block can be converted into optical signals having a predetermined wavelength by a light emitting element, and can be propagated through the optical waveguide. The optical signals having a predetermined wavelength propagated through the optical waveguide can be converted into electrical signals by a light receiving element, and can be input to another circuit block. Therefore, according to an aspect of the present invention, a plurality of light emitting elements or light receiving elements having different emitting wavelengths or different receiving wavelengths can be connected to the circuit blocks, so that the wavelength multiplexing transmission can be executed between the circuit blocks.

Furthermore, in the wavelength multiplexing on-chip optical interconnection circuit according to an aspect of the present invention, it is also preferable that the light emitting element is a first micro-tile shaped element, a plurality of the first micro-tile shaped elements are provided on the integrated circuit chip, each of the first micro-tile shaped elements emits any one of the two or more light components having different wavelengths, the light receiving element is a second micro-tile shaped element, a plurality of the second micro-tile shaped elements is provided on the integrated circuit chip, and each of the second micro-tile shaped elements selectively receives any one of the two or more light components having different wavelengths.

According to an aspect of the present invention, the first micro-tile shaped element constituting the light emitting element and the second micro-tile shaped element constituting the light receiving element, can be formed in a very small shape (for example, having an area of several hundred micrometers square or less and a thickness of several ten or less micrometers). In addition, the first micro-tile shaped elements and the second micro-tile shaped elements can be attached to desired positions on the integrated circuit chip or the circuit blocks using an adhesive. Therefore, according to an aspect of the present invention, it is possible to provide a system having a simple and compact structure and capable of processing signals at a higher speed than that in the related art.

Furthermore, in the wavelength multiplexing on-chip optical interconnection circuit according to an aspect of the present invention, it is also preferable that the first micro-tile shaped elements or the second micro-tile shaped elements are attached to the top surfaces of the circuit blocks, and the first micro-tile shaped elements or the second micro-tile shaped elements are electrically connected to the circuit blocks.

Accordingly, since the first or second micro-tile shaped elements are directly attached to desired positions on the top surfaces of the circuit blocks, the length of wiring lines between input/output terminal for electrical signals and the first or second micro-tile shaped elements in the circuit blocks can be reduced. Therefore, according to an aspect of the present invention, it is also possible to accomplish the speedup of transmission and compactness.

Furthermore, in the wavelength multiplexing on-chip optical interconnection circuit according to an aspect of the present invention, it is also preferable that at least a part of the optical waveguide covers the first micro-tile shaped elements or the second micro-tile shaped elements.

According to an aspect of the present invention, all the light components emitted from the first micro-tile shaped elements can be input into the optical waveguide. In addition, the second micro-tile shaped elements can efficiently receive the optical signals propagated through the optical waveguide. Therefore, according to an aspect of the present invention, it is possible to provide the wavelength multiplexing on-chip optical interconnection circuit having a simple and easily-manufactured structure.

Furthermore, in the wavelength multiplexing on-chip optical interconnection circuit according to an aspect of the present invention, it is also preferable that the circuit blocks are any one of a CPU, a memory circuit, a DSP, an RF amplifying circuit, an image sensor, and a bio sensor, and the optical waveguide is a transmission line of data signals or clock signals.

According to an aspect of the present invention, it is possible to enhance the signal transmission speed between the CPU and the memory circuit, which was a bottleneck of a high-speed information processing in the related art computer system. Further, according to an aspect of the present invention, since the related art structure, in which a bus between the CPU and the memory circuit, is constructed using a plurality of metal wiring lines can be replaced with, for example, one optical waveguide and a plurality of micro-tile shaped elements, it is possible to provide a more compact and higher-performance computer system.

Furthermore, in the wavelength multiplexing on-chip optical interconnection circuit according to an aspect of the present invention, it is also preferable that a plurality of the first micro-tile shaped elements or a plurality of the second micro-tile shaped elements is provided on one of the circuit blocks, and the plurality of first micro-tile shaped elements or the plurality of second micro-tile shaped elements has emitting wavelengths or receiving wavelengths different from each other.

According to an aspect of the present invention, when the plurality of micro-tile shaped elements provided on any circuit block emit optical signals having wavelengths of $\lambda 1$, $\lambda 2$, $\lambda 3$, ..., a plurality of output signals (electrical signals) of the circuit block can be transmitted through one optical waveguide as plural kinds of optical signals. Further, a plurality of second micro-tile shaped elements provided on another circuit block may selectively receive, for example, the optical signals having wavelengths of $\lambda 1$, $\lambda 2$, $\lambda 3$, .... Therefore, according to an aspect of the present invention, the wavelength multiplexing transmission can be executed between the circuit blocks or between a circuit block and another circuit block, etc.

Furthermore, in the wavelength multiplexing on-chip optical interconnection circuit according to an aspect of the present invention, it is also preferable that a plurality of the integrated circuit chips is mounted on a substrate, and the plurality of integrated circuit chips are optically connected to each other at least through the micro-tile shaped elements having a light emitting function or a light receiving function and the optical waveguide provided on the substrate.

According to an aspect of the present invention, by providing a plurality of integrated circuit chips having the wavelength multiplexing on-chip interconnection circuit on a substrate, it is also possible to execute the wavelength multiplexing transmission between the integrated circuit chips. Therefore, according to an aspect of the present invention, it is possible to compactly construct a large-scaled computer system or an electro-optical device, such as a liquid crystal display device including a plurality of integrated circuit chips, and to operate it at a high speed.

Furthermore, in the wavelength multiplexing on-chip optical interconnection circuit according to an aspect of the present invention, it is also preferable that a plurality of the integrated circuit chips is mounted on a substrate, the integrated circuit chips are tightly bonded to each other, and the integrated circuit chips are optically or electrically connected to each other.

According to an aspect of the present invention, since the integrated circuit chips capable of executing the wavelength multiplexing transmission in a chip are tightly bonded to each other and mounted on a substrate, it is possible to optically and electrically connect the integrated circuit chips to each other simply. Therefore, according to an aspect of the present invention, it is possible to execute the wavelength multiplexing transmission between the integrated circuit chips as well as within each of the integrated circuit chips, so that it is possible to further accomplish high-speed operation and compactness of the system including a plurality of integrated circuit chips.

An electro-optical device according to an aspect of the present invention includes the wavelength multiplexing on-chip optical interconnection circuit.

According to an aspect of the present invention, in an electro-optical device, such as a liquid crystal display device, an electroluminescence panel and a plasma display panel, a timing control circuit to generate scanning signals and data signals from image signals and driver circuits, etc. can be constructed using the wavelength multiplexing on-chip optical interconnection circuit. Further, the timing control circuit and the driver circuits, etc. may be constructed as the circuit blocks, so that the timing control circuit and various driver circuits may be constructed using one integrated circuit chip. Therefore, according to an aspect of the present invention, it is possible to realize compactness of the electro-optical device, enlargement of a screen, and high-quality display.

An electronic apparatus according to an aspect of the present invention includes the wavelength multiplexing on-chip optical interconnection circuit.

According to an aspect of the present invention, by constructing an electronic apparatus in which processing units, such as a CPU and memory circuits are implemented with a module including the wavelength multiplexing on-chip optical interconnection circuit, it is possible to inexpensively provide a compact and high-performance electronic apparatus capable of processing signals at a higher speed than that in the related art case.

BRIEF DESCRIPTION OF THE DRAWINGS

FIGS. 2A and 2B are a side view and a plan view of a circuit element according to an exemplary embodiment of the present invention;

FIGS. 6(A) and 6(B) are a side view and a plan view illustrating a modified example of the circuit element described above;

FIGS. 7(A) and 7B) are a side view and a plan view illustrating a modified example of the circuit element described above;

FIGS. 8(A) and 8(B) are a side view and a plan view illustrating a modified example of the circuit element described above;

FIGS. 9(A) and 9(B) are a side view and a plan view illustrating a modified example of the circuit element described above;

DETAILED DESCRIPTION OF PREFERRED EMBODIMENTS

Now, a wavelength multiplexing on-chip optical interconnection circuit according to exemplary embodiments of the present invention will be described with reference to the accompanying figures.

First Exemplary Embodiment

Figure 1:
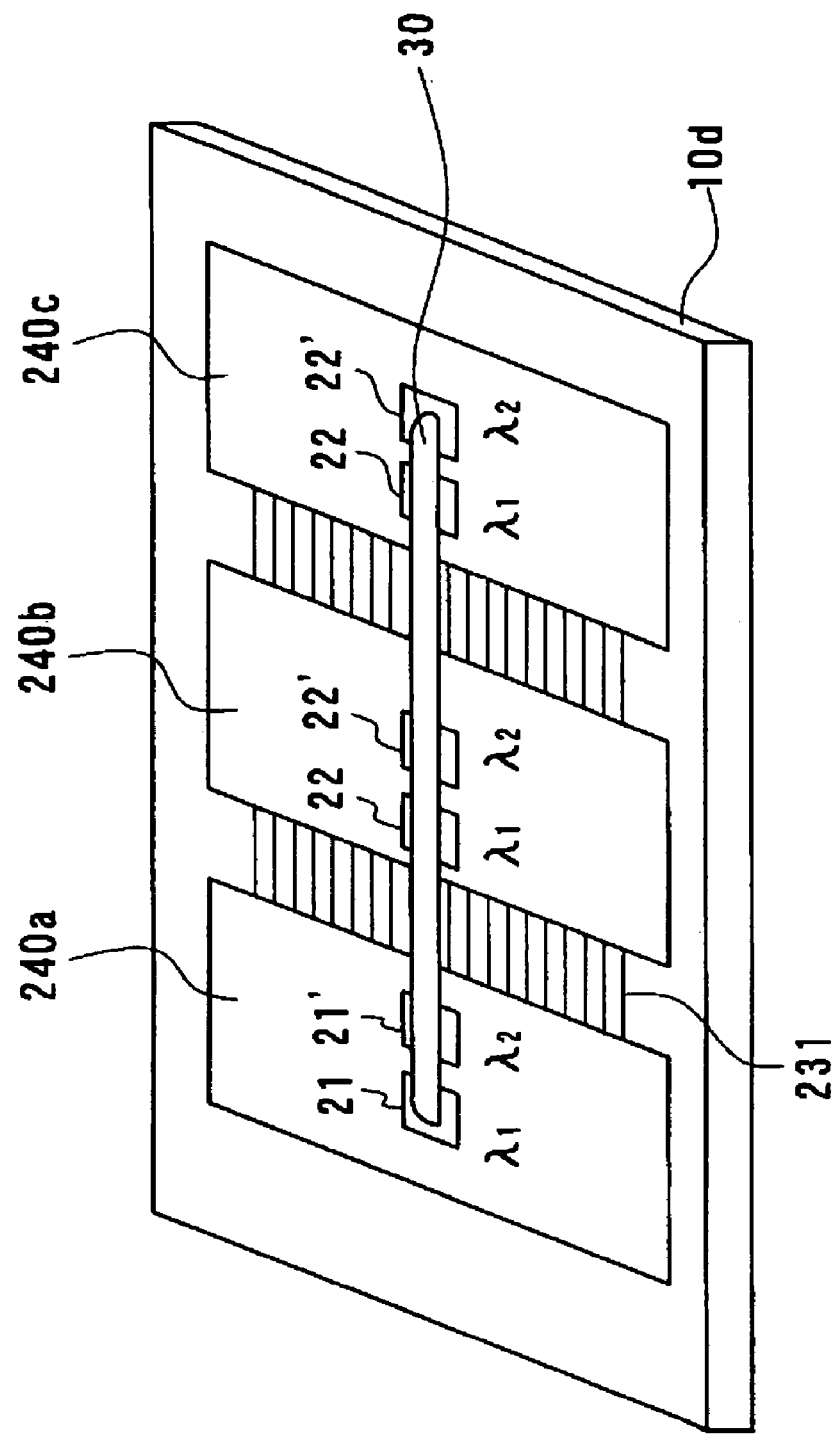
FIG. 1 is a perspective view illustrating an integrated circuit chip according to an exemplary embodiment of the present invention.

In this exemplary embodiment, a plurality of circuit blocks provided on one integrated circuit chip (an IC chip, an LSI chip, etc.) are optically connected to each other through an optical waveguide or the like. Then, by allowing light components having different wavelengths to pass through one optical waveguide, independent parallel transmission using optical signals is executed. FIG. 1 is a perspective view illustrating a wavelength multiplexing on-chip optical interconnection circuit according to the first exemplary embodiment of the present invention.

On one integrated circuit chip 10d, three circuit blocks (sometimes referred to as cores) 240a, 240b, and 240c are formed. The integrated circuit chip 10d includes a semiconductor chip. The number of circuit blocks to be formed on the integrated circuit chip 10d is not limited to three, but may be two or more. Further, on the integrated circuit chip 10d, circuits or electronic elements (for example, constituting pixels), etc. may be formed in addition to the circuit blocks.

The circuit blocks 240a, 240b, and 240c constitute a CPU, a memory circuit, an image signal processing circuit, an image signal drive circuit, a communication I/O, various interface circuits, an A/D converter, a D/A converter, etc. For example, the circuit block 240a constitutes a CPU, the circuit block 240b constitutes a first memory circuit, and the circuit block 240c constitutes a second memory circuit. Further, the circuit blocks 240a, 240b, and 240c can be formed on the integrated circuit chip 10d, as a bipolar integrated circuit, a MOS integrated circuit, a CMOS integrated circuit or an SOS (Silicon On Sapphire) integrated circuit, etc.

The circuit blocks 240a, 240b, and 240c are electrically connected to each other through a plurality of metal wiring lines 231.

First micro-tile shaped elements 21 and 21' including light emitting elements are attached to a top surface of the circuit block 240a. The first micro-tile shaped elements 21 and 21' are electrically connected to the circuit block 240a. Further, second micro-tile shaped elements 22 and 22', including light receiving elements, are attached to a top surface of the circuit block 240b. The second micro-tile shaped elements 22 and 22' are electrically connected to the circuit block 240b. Furthermore, the second micro-tile shaped elements 22 and 22' include light receiving elements, are attached to a top surface of the circuit block 240c. The second micro-tile shaped elements 22 and 22' are electrically connected to the circuit block 240c.

The first and second micro-tile shaped elements 21, 21', 22 and 22' are elements having a micro-tile shape. The first micro-tile shaped elements 21 and 21' having a light emitting function include, for example, a VCSEL (Vertical Cavity Surface Emitting laser), a built-in DFB (Distributed FeedBack) laser to absorb and modulate electric field, or LED, etc. The second micro-tile shaped elements 22 and 22' having a light receiving function include, for example, a photodiode or a phototransistor. The first and second micro-tile shaped elements 21, 21', 22 and 22' have an area of several hundred micrometers square or less and a thickness of several ten micrometers or less, and are attached to a surface of the integrated circuit chip 10d through an adhesive, etc. A manufacturing method and a mounting method of the first and second micro-tile shaped elements 21, 21', 22 and 22' will be described in detail below.

The first micro-tile shaped element 21 selectively emits a light component having a wavelength of $\lambda 1$, and the first micro-tile shaped element 21' selectively emits a light component having a wavelength of $\lambda 2$. On the other hand, the second micro-tile shaped element 22 selectively receives the light component having a wavelength of $\lambda 1$, and the second micro-tile shaped element 22' selectively receives the light component having a wavelength of $\lambda 2$.

On the integrated circuit chip 10d, an optical waveguide 30 is also formed. The optical waveguide 30 is made of an optical waveguide material formed in a rod shape on the top surface of the integrated circuit chip 10d, the top surfaces of the circuit blocks 240a, 240b, and 240c, and a top surface of the metal wiring lines 231. It is preferable that a thickness (height) of the optical waveguide material has a value larger than a step difference formed by a surface of the integrated circuit chip 10d and the circuit blocks 240a, 240b, and 240c or by the micro-tile shaped elements and the metal wiring lines 231. Therefore, an optical coupling efficiency in the optical waveguide 30 can be enhanced.

The optical waveguide 30 is not limited to a straight-line shape shown in FIG. 1, but may be provided with a bending or a branch, or may be formed in a loop shape.

The optical waveguide material can employ a transparent resin or a sol-gel glass, etc. The optical waveguide material constituting the optical waveguide 30 covers the respective micro-tile shaped elements. Therefore, the first and second micro-tile shaped elements 21, 21', 22 and 22' are optically connected through the optical waveguide 30. That is, the light components (having wavelengths of $\lambda 1$ and $\lambda 2$, respectively) emitted from the first micro-tile shaped elements 21 and 21' are all input into the optical waveguide 30, and propagated through the optical waveguide 30. Further, the second micro-tile shaped element 22 selectively detects the light component of a wavelength $\lambda 1$ from the light components propagated through the optical waveguide 30, and the second micro-tile shaped element 22' selectively detects the light component of a wavelength $\lambda 2$ from the light components propagated through the optical waveguide 30.

Furthermore, on a surface of the optical waveguide material constituting the optical waveguide 30, a light absorbing film or a light reflecting film to reduce or prevent a disturbing light from being input may be formed.

Because of this construction, for example, a first signal (data) output from the circuit block 240a constituting a CPU is converted into an optical pulse signal having a wavelength of $\lambda 1$ by the first micro-tile shaped element 21 on the circuit block 240a. Further, a second signal (data) output from the circuit block 240a is converted into an optical pulse signal having a wavelength of $\lambda 2$ by the first micro-tile shaped element 21' on the circuit block 240a.

The optical pulse signals having wavelengths of $\lambda 1$ and $\lambda 2$ are input to the optical wavelength 30, and propagated through the optical wavelength 30. Then, the optical pulse signal having a wavelength of $\lambda 1$, is converted into an electrical signal by the second micro-tile shaped element 22 on each of the circuit blocks 240b and 240c, and input as the first signal to the circuit blocks 240b and 240c, respectively. Further, the optical pulse signal having a wavelength of λ2 is converted into an electrical signal by the second micro-tile shaped element 22' on each of the circuit blocks 240b and 240c, and input as the second signal to the circuit blocks 240b and 240c, respectively.

As a result, according to this exemplary embodiment, using the first and second micro-tile shaped elements 21, 21', 22 and 22' having a light emitting function or a light receiving function with a wavelength selectivity, a plurality of signals (first signal, second signal) can be independently and simultaneously transmitted in parallel between the circuit blocks 240a, 240b, and 240c on the integrated circuit chip 10d. That is, according to this exemplary embodiment, since a wavelength multiplexing transmission can be executed between the circuit blocks 240a, 240b, and 240c on the integrated circuit chip 10d, it is possible to transmit data at a very high speed.

The signal to be propagated through the optical waveguide 30 is not limited to data, but may be a clock signal. For example, a first clock signal is emitted from the first micro-tile shaped element 21 of the circuit block 240a, and a second clock signal is emitted from the first micro-tile shaped element 21' of the circuit block 240a. The first clock signal is propagated through the optical waveguide 30, detected by the second micro-tile shaped elements 22 of the other circuit blocks 240b and 240c, and then input to the circuit blocks 240b and 240c. Further, the second clock signal is propagated through the optical waveguide 30, detected by the second micro-tile shaped elements 22' of the other circuit blocks 240b and 240c, and then input to the circuit blocks 240b and 240c. As a result, since a plurality of kinds of clock signals having relatively high frequencies can be distributed using one optical waveguide 30, the circuit blocks 240a, 240b, and 240c can be operated at a high speed.

Furthermore, in this exemplary embodiment, since the electrical signals are converted into optical signals by the first and second micro-tile shaped elements 21, 21', 22 and 22' attached onto the respective circuit blocks 240a, 240b, and 240c, it is possible to simply manufacture a very compact optical-signal transmission device.

Furthermore, in this exemplary embodiment, the circuit blocks 240a, 240b, and 240c are electrically connected to each other through metal wiring lines 231. Therefore, signals and power supply not requiring transmission of a relatively high speed can be transmitted through the metal wiring lines 231.

Furthermore, in this exemplary embodiment, the optical waveguide 30 traverses the circuit block 240b. Therefore, the length of the optical waveguide 30 can be shortened. The optical waveguide 30 can be formed in any region as well as the top surfaces of the circuit blocks 240a, 240b, and 240c, on the integrated circuit chip 10d.

The optical waveguide 30 may be formed on a surface of the integrated circuit chip 10d so as to detour around the circuit blocks 240a, 240b, and 240c. As a result, even when the region surfaces of the circuit blocks 240a, 240b, and 240c and the other region surface on the surface of the integrated circuit chip 10d form a large step difference, the optical waveguide 30 can be provided on a flat surface, so that it is possible to enhance the optical coupling efficiency in the course of the transmission of optical signals.

In the exemplary embodiment shown in FIG. 1, although the first micro-tile shaped elements 21 and 21' having a light emitting function are provided on the circuit block 240a and the second micro-tile shaped elements 22 and 22' having a light receiving function are provided on the circuit blocks 240b and 240c, each of the circuit blocks 240a, 240b, and 240c may be provided with the first micro-tile shaped elements 21 and 21' and the second micro-tile shaped elements 22 and 22'. As a result, the bidirectional wavelength multiplexing transmission can be executed between the circuit blocks 240a, 240b, and 240c.

In the exemplary embodiment shown in FIG. 1, although the circuit blocks 240a, 240b, and 240c are connected each other through one optical waveguide 30, the circuit blocks 240a, 240b, and 240c may be connected to each other using a plurality of optical waveguides 30 and a plurality of first and second micro-tile shaped elements 21, 21', 22 and 22' connected to the optical waveguides. Further, in the exemplary embodiment shown in FIG. 1, although all the circuit blocks 240a, 240b, and 240c are connected to each other through the optical waveguide 30, only some of the circuit blocks (for example, the circuit block 240a and the circuit block 240b) may be connected to each other through the optical waveguide 30.

The integrated circuit chip 10d shown in FIG. 1 can be mounted on a desired substrate, where it is preferable that it is mounted using a flip-chip mounting method. As a result, it is possible to simply and compactly construct a high-performance information processing system. Furthermore, a plurality of integrated circuit chips 10d, shown in FIG. 1, may be mounted on a desired substrate. In this case, it is preferable that side surfaces of the integrated circuit chips 10d are tightly bonded to each other and then arranged on the substrate. The integrated circuit chips 10d can be tightly bonded to each other and mounted simply using the flip-chip mounting method.

Through such a mounting method, surfaces or rear faces of the integrated circuit chips 10d can be attached to one plane to form a sheet of plane, and then the optical waveguide 30 can be easily formed on the sheet of plane. Accordingly, it is also possible to easily connect the integrated circuit chips 10d to each other through the optical wave guide 30 and the first and second micro-tile shaped elements 21, 21', 22 and 22'. Therefore, it is possible to simply enhance compactness and performance of a large-scaled computer system including a plurality of integrated circuit chips 10d.

In this exemplary embodiment, for example, the circuit block 240a constitutes CPU, the circuit block 240b constitutes a first memory circuit, and the circuit block 240c constitutes a second memory circuit. Then, data can be transmitted concurrently from the CPU to a plurality of memory circuits. As a result, a striping of dividing and concurrently writing one or plural data output from the CPU in the plurality of memory circuits can be performed, and thus it is possible to further increase the speed of the data transmission between the CPU and the memory circuits.

Optical Interconnection Circuit

Next, an optical interconnection circuit, which is an element of the wavelength multiplexing on-chip optical interconnection circuit according to this exemplary embodiment, will be described in detail. Hereinafter, although a case will be described that the optical interconnection circuit including micro-tile shaped elements and an optical waveguide is formed on a surface of a substrate 10, this optical interconnection circuit may be formed on the integrated circuit chip 10d shown in FIG. 1, similarly.

FIG. 2 shows the optical interconnection circuit according to this exemplary embodiment, where FIG. 2(a) is a schematic side view and FIG. 2(b) is a schematic plan view. The same elements as those in the above exemplary embodiment are indicated by the same reference numerals.

The optical interconnection circuit according to this exemplary embodiment includes a first micro-tile shaped element 21 and a second micro-tile shaped element 22 attached on a surface of a substrate 10, and an optical waveguide 30 including an optical waveguide material formed on a surface of the substrate 10 to connect the first micro-tile shaped element 21 and the second micro-tile shaped element 22 to each other. As the optical waveguide material constituting the optical waveguide 30, a transparent resin or a sol-gel glass can be employed. As the substrate 10, any one of glass epoxy, ceramics, plastic, polyimide, silicon or glass can be employed.

The first micro-tile shaped element 21 includes a light emitting part 21a capable of emitting light. The second micro-tile shaped element 22 includes a light receiving part 22b capable of receiving light. Accordingly, at least the light emitting part 21a of the first micro-tile shaped element 21 and the light receiving part 22b of the second micro-tile shaped element 22 are covered with the optical waveguide material, which constitutes the optical waveguide 30.

With such a configuration, the light emitted from the light emitting part 21a of the first micro-tile shaped element 21 propagates along the optical waveguide 30 and reaches the light receiving part 22b of the second micro-tile shaped element 22. Accordingly, when an optical signal is emitted from the light emitting part 21a by controlling the light emitting operation of the light emitting part 21a, the optical signal propagates along the optical waveguide 30, and the optical signal can be detected from the light receiving part 22b.

Further, the optical signal emitted from the first micro-tile shaped element 21 propagates along the optical waveguide 30 and is incident on the second micro-tile shaped element 22. Furthermore, the signal passes through the second micro-tile shaped element 22. As a result, it is possible to almost simultaneously transmit optical signals from one micro-tile shaped element 21 to a plurality of second micro-tile shaped elements 22. Herein, when a thickness of the second micro-tile shaped element 22 is set to 20 μm or less, the step difference between the substrate and the second micro-shaped element 22 becomes sufficiently small. Thus, as shown in FIG. 2, the optical waveguide 30 can be formed consecutively regardless of the step difference. When the optical waveguide 30 is formed consecutively at the step portion, light transmission loss, such as scattering, can be neglected because the step difference is sufficiently small. For such reason, a specific configuration or an optical element to alleviate the step difference is unnecessary. Thus, it is possible to simply and cheaply fabricate it. Further, the thickness of the optical waveguide material forming the optical waveguide 30 can be dozen or less micrometers.

The first micro-tile shaped element 21 includes, for example, an LED, a VCSEL, and a DFB laser having an electric field absorbing modulator. Although the LED has the simplest structure and the easiest fabrication step as a light emitting device, it has a slow modulation speed of the optical signals of several hundred Mbps. In contrast, because the VCSEL has a high modulation speed of 10 Gbps or more, a small threshold current, and high light-emitting efficiency, it is possible to drive it with low power consumption. In the DFB laser, although modulation speed is 1 Gbps, less than that of the VCSEL, it is possible to transmit optical signals with higher efficiency than the VCSEL since laser beam is emitted from the end of the micro-tile shape in a direction parallel to the plane of the substrate 10, i.e., in a direction along the optical waveguide 30.

The second micro-tile shaped element 22 includes, for example, a photodiode or a phototransistor. Herein, as the photodiode, a PIN type photodiode, an APD (Avalanche Photo Diode), an MSM type photo diode can be selected for use. The APD has high photosensitivity and response frequency. The MSM type photodiode has a simple structure and is easily integrated with an amplifying transistor.

Further, a third micro-tile shaped element (not shown), which is composed of a light receiving element, may be formed to overlap the first micro-tile shaped element 21. When being formed in such a manner, the quantity of light emitted from the first micro-tile shaped element 21 is monitored by the third micro-tile shaped element, and then the monitored value is fed back to the first micro-tile shaped element 21. As a result, APC function is attained, so stable optical data transmission can be achieved. Alternatively, the APC function may be built in the first micro-tile shaped element 21 itself. Further, it is desirable that the second micro-tile shaped element 22 should have an amplifying circuit to amplify the detected signals. As a result, it is possible to further enhance the efficiency of the apparatus.

Hence, the first micro-tile shaped element 21 and the second micro-tile shaped element 22 are electrically connected to an electronic circuit (not shown), such as an integrated circuit, an EL display circuit, a plasma display, a liquid crystal display circuit, and the like, which are provided on the substrate 10. As a result, the computer system, including integrated circuits, can be compact and have higher operation speed than the related art. Further, by the optical interconnection circuit according to the present exemplary embodiment, it is possible to transmit the scanning signals of a planar display provided on the substrate 10 at high speed and to achieve the planar display device having the enlarged screen and high quality images.

In FIG. 2, although each of the first micro-tile shaped element 21 and the second micro-tile shaped element 22 is coupled to one optical waveguide 30, a plurality of the second micro-tile shaped elements 22 may be connected thereto. In such case, it is possible for optical signals emitted from one first micro-tile shaped element 21 (light emitting element) to propagate along the optical waveguide 30 and to be simultaneously detected at the plurality of second micro-tile shaped elements 22. This is equal to the bus lines for plural elements.

In addition, a plurality of the first micro-tile shaped elements 21 and a plurality of the second micro-tile shaped elements 22 may be formed. In such a case, the wavelength of light emitted from each of the first micro-tile shaped elements 21 may be different. It is desirable that each of the second micro-tile shaped elements 22 should be light receiving device capable of selecting a wavelength corresponding to that of the light emitted from at least one first micro-tile shaped element 21. As a result, it is possible for optical signals emitted from the first micro-tile shaped elements 21 to propagate along the optical waveguide 30 simultaneously and to be detected at the respective second micro-tile shaped elements 22. Thus, it is possible to simply and easily constitute a bus capable of transmitting and receiving optical signals in parallel.

In addition, while being formed in a linear shape shown in FIG. 2, the optical waveguide 30 may be formed in a curved shape or in a branch shape. Further, the optical waveguide 30 may be formed in a loop shape. The optical waveguide 30 may be formed in a sheet shape to cover the plurality of tile-shaped elements. To be sure, it is also possible for plural sets of the first micro-tile shaped elements 21, the second micro-tile shaped elements 22, and the optical waveguide 30 to be formed on the top surface of one substrate 10. Moreover, it is also possible for the first micro-tile shaped element 21, the second micro-tile shaped element 22, and the optical waveguide 30 to be formed on both of the front and back surfaces of the substrate 10.

Figure 3:
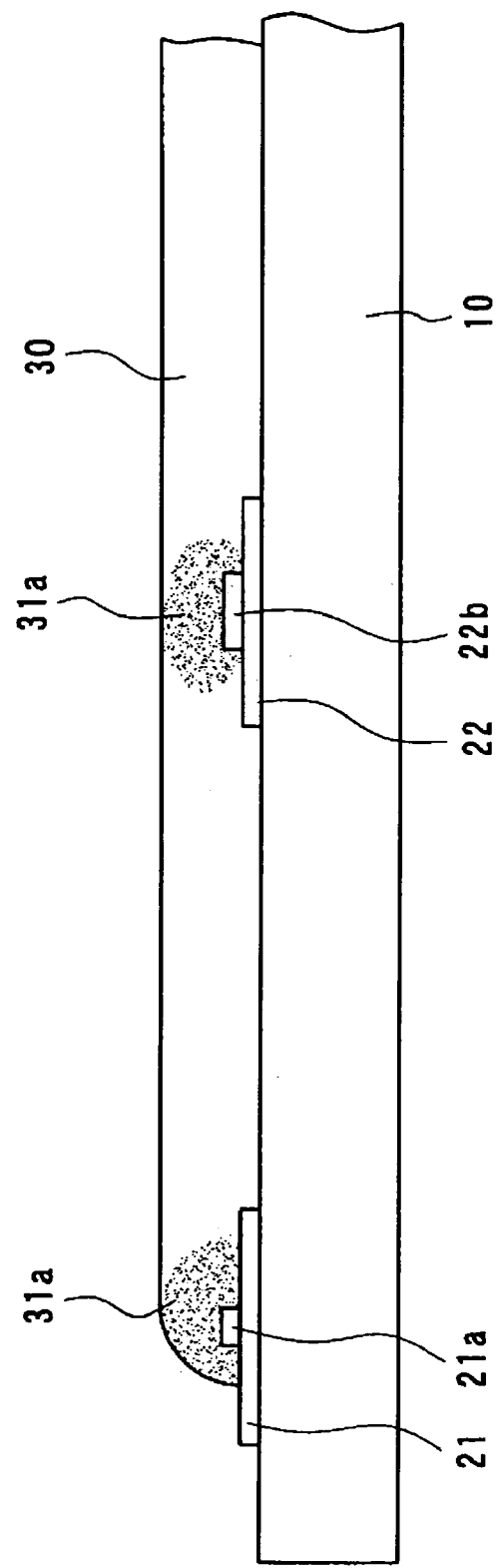
FIG. 3 is a side view illustrating a modified example of the circuit element described above.

Then, a modified example of the optical interconnection circuit according to the present exemplary embodiment will be described with reference to FIGS. 3 to 6. Unlike the exemplary embodiment of FIG. 2, the present exemplary embodiment has a light scattering frame to scatter light at the optical waveguide 30 positioned in the neighborhood of the first micro-tile shaped element 21 and the second micro-tile shaped element 22. FIG. 3 is a schematic side view illustrating a modified example of the optical interconnection circuit according to the present exemplary embodiment.

In the optical interconnection circuit, light scattering particles forming a light scattering frame 31a are dispersed in the neighborhood of the first micro-tile shaped element 21 and the second micro-tile shaped element 22, in the optical waveguide material forming the optical waveguide 30. For example, silica particle, glass particle, metal particle, or the like may be used as the light scattering particle. The optical waveguide 30 having such light scattering frame 31a uses a liquid droplet discharging manner to discharge a liquid droplet from, for example, a dispenser, an inkjet nozzle, or the like. Specifically, the optical waveguide 30 having such light scattering frame 31a is formed by discharging a liquid optical waveguide material (such as resin) from one inkjet nozzle to a desired portion and then by discharging a liquid optical waveguide material containing light scattering particles from another inkjet nozzle to a desired portion.

Further, except for resin, sol gel glass can be used as a material forming the optical waveguide 30. A method of fabricating the sol gel glass includes the steps of: adding an acid to metal alkoxide to form a liquid mixture; hydrolyzing the liquid mixture; applying the hydrolyzed solution to a desired portion; and adding energy such as heat to it so as to make glass.

Figure 4:
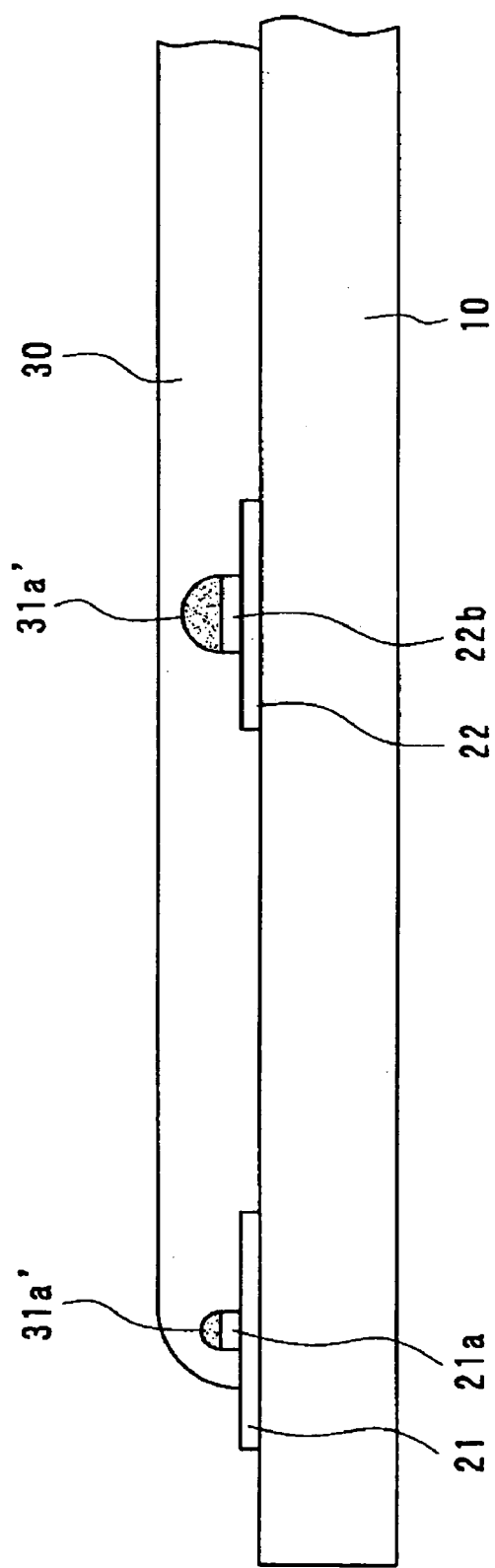
FIG. 4 is a side view illustrating a modified example of the circuit element described above.

FIG. 4 is a schematic side view illustrating another modified example of the optical interconnection circuit according to the present exemplary embodiment. A light scattering frame 31a' of the optical interconnection circuit is a dome-shaped light scattering frame made of resin or glass, in which light scattering particles are dispersed. An optical waveguide 30 is formed to cover such light scattering frame 31a' (the dome-shaped light scattering frame). It is possible to easily adjust the optical coupling efficiency between the optical waveguide 30 and a first micro-tile shaped element 21 or a second micro-tile shaped element 22 because as compared with the light scattering frame shown in FIG. 3, it is easy to control the size and shape of such light scattering frame 31a'.

Next, a method of fabricating the light scattering frame 31a' will be described. First, an acid is added to metal alkoxide, such as liquid resin or silica ethyl containing light scattering particles, using an inkjet, a dispenser, and the like, and the liquid mixture is hydrolyzed. Then the hydrolyzed solution is applied to a desired portion of a substrate 10 in a dome shape. Then, energy such as heat is supplied to the applied portion to make the solution hardened or glassed. As a result, the light scattering frame 31a' having a dome shape is formed on the first micro-tile shaped element 21 and the second micro-tile shaped element 22. Next, a linear-shaped optical waveguide 30 is formed using transparent resin or sol gel glass to cover the light scattering frame 31a' having a dome shape.

Figure 5:
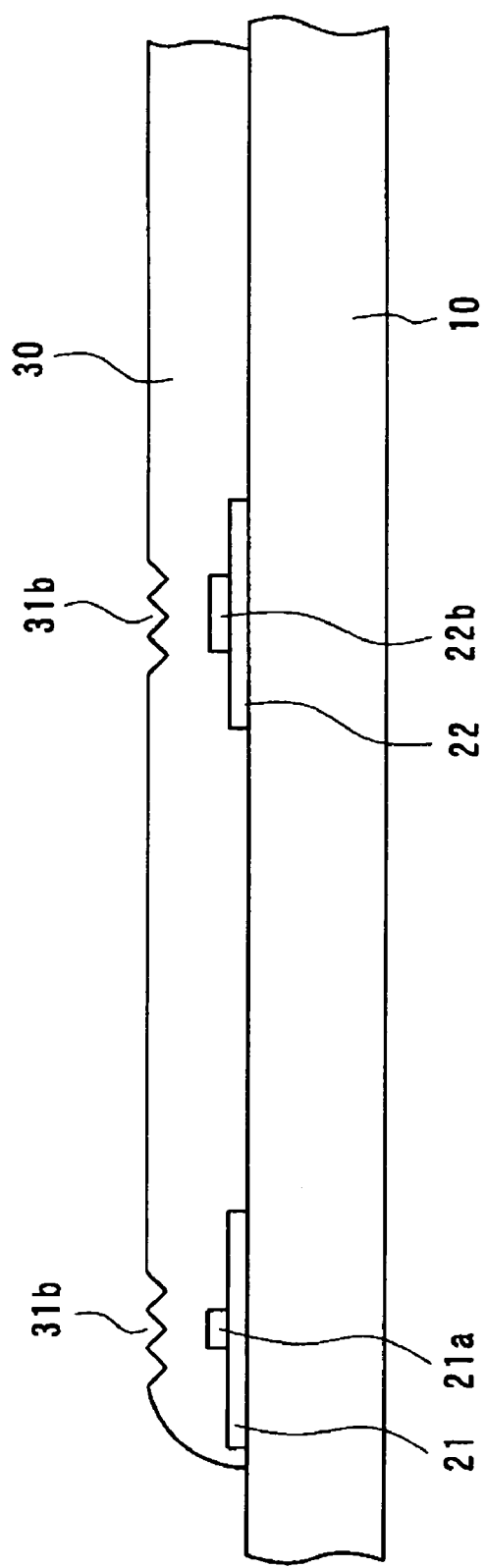
FIG. 5 is a side view illustrating a modified example of the circuit element described above.

FIG. 5 is a schematic side view illustrating another modified example of the optical interconnection circuit according to the present exemplary embodiment. A light scattering frame 31b of the optical interconnection circuit has a configuration in which a surface of an optical waveguide material forming an optical waveguide 30 has concave and convex portions. Such light scattering frame 31b is also formed in the neighborhood of a first micro-tile shaped element 21 and a second tile-shaped element 22. Herein, the concave and convex portions constituting the light scattering frame 31b are formed by an embossing process or a stamper transfer.

FIG. 6 illustrates a modified example of the optical interconnection circuit according to the present exemplary embodiment. FIG. 6(a) is a schematic side view thereof, and FIG. 6(b) is a schematic plan view thereof. A light scattering frame 31c of the optical interconnection circuit has a configuration in which the line width and height of an optical waveguide material forming an optical waveguide 30 vary. That is, in the optical waveguide 30, the line width and height of the optical waveguide material is narrow in the neighborhood of a light receiving part 22b of the second micro-tile shaped element 22.

Hereinafter, a method of fabricating the optical waveguide 30 having the light scattering frame 31c will be described. First, a first micro-tile shaped element 21 and the second micro-tile shaped 22 adhere to a predetermined portion of the surface of the substrate 10. Then, liquid repellent treatment is performed to the entire surface of the substrate 10 and the entire surfaces of the first micro-tile shaped element 21 and the second micro-tile shaped element 22. Next, on the surface subjected to the liquid repellent treatment, a lyophilic treatment is performed to a portion in which the optical waveguide 30 is formed. Herein, a portion subjected to a lyophilic treatment has a linear shape having a partly narrowed line width in the neighborhood of the light receiving part 22b of the second micro-tile shaped element 22. Further, the lyophilic treatment is executed by the radiation of UV light.

Next, a liquid optical waveguide material is dropped from the inkjet nozzle to the inside of the portion subjected to the lyophilic treatment. Accordingly, the dropped optical waveguide material is permeated into the portion subjected to the lyophilic treatment and is repelled from the portion subjected to the liquid repellent treatment, and surface tension acts thereto. As a result, such optical waveguide material becomes a linear shape having a narrowed width portion in the neighborhood of the light receiving part 22b as shown in FIG. 6.

As described above, in the optical waveguide 30, by providing the light scattering frames 31a, 31b, 31c in the neighborhood of the first micro-tile shaped element 21, it is possible that the optical signals emitted from the first micro-tile shaped element 21 are scattered from the light scattering frames 31a, 31b, and 31c and effectively propagate along the whole optical waveguide. Further, by providing the light scattering frames 31a, 31b, and 31c in the neighborhood of the second micro-tile shaped element 22, it is possible that optical signals, which have propagated along the optical waveguide 30, are scattered in the neighborhood of the second micro-tile shaped element 22 and are effectively incident on the second micro-tile shaped element 22.

Next, still another modified example of the optical interconnection circuit according to the present exemplary embodiment will be described with reference to FIGS. 7 to 9. Unlike the exemplary embodiment described above, the present exemplary embodiment has light reflecting frames to reflect light at the neighborhood of a first micro-tile shaped element 21 in an optical waveguide 30 and a second micro-tile shaped element 22 or at the end of an optical waveguide 30. FIG. 7 illustrates a modified example of the optical interconnection circuit according to the present exemplary embodiment. FIG. 7(a) is a schematic side view thereof, and FIG. 7(b) is a schematic plan view thereof.

For example, the light reflecting frames 32a and 32b are formed by forming a metal film over the surface of an optical waveguide material forming the optical waveguide 30. In addition, the light reflecting frames 32a and 32b may be formed by applying paints containing metal fine particles over the surface of the optical waveguide material forming the optical waveguide 30. Fine particles, such as silver, aluminum, magnesium, copper, nickel, titanium, chrome, and zinc, are applied as the metal fine particles. Paints may be discharged from the inkjet nozzle to form the metal film and to apply paints containing the metal fine particles forming the light reflecting frames 32a and 32b. It is also possible that the light reflecting frame 32a and the light reflecting frame 32b may be formed over the whole optical waveguide 30.

With such a configuration, the optical signals emitted from the first micro-tile shaped element 21 are reflected from the light reflecting frame 32a in a direction along the optical waveguide 30, and a part of the optical signals is reflected again from the light reflecting frame 32b to the direction of the second micro-tile shaped element 22. Thus, according to the present exemplary embodiment, it is possible to effectively transmit optical signals.

FIG. 8 illustrates still another modified example of the optical interconnection circuit according to the present exemplary embodiment. FIG. 8(a) is a schematic side view thereof, and FIG. 8(b) is a schematic plan view thereof. A light reflecting frame 32c of the optical interconnection circuit has a configuration in which a reflecting plate with a reflecting surface is attached to an end of the optical waveguide 30. Herein, the reflecting surface of the reflecting frame 32c is provided to incline, e.g., 45° with respect to the surface of the substrate 10.

Further, two optical waveguide 30a and 30b, which are parallel to each other, are provided in the optical interconnection circuit. Moreover, the light reflecting frame 32c is composed of a reflecting plate which is provided at one end of two optical waveguides 30a and 30b and is commonly used for the two optical waveguides 30a and 30b. Thus, the optical signals emitted from each of two first micro-tile shaped elements 21 are reflected by the light reflecting frame 32c in a direction along the optical waveguides 30a and 30b, respectively. As a result, according to the present exemplary embodiment, it is possible to effectively transmit optical signals and to effectively fabricate an optical interconnection circuit.

Moreover, in FIG. 8, although the common reflecting frame 32c to two optical waveguides 30a and 30b is provided, the common light reflecting frame 32c to three or more optical waveguides may preferably be provided.

FIG. 9 illustrates still another modified example of the optical interconnection circuit according to the present exemplary embodiment. FIG. 9(a) is a schematic side view thereof, and FIG. 9(b) is a schematic plan view thereof. Light reflecting frames 32d and 32e of the present optical interconnection circuit are plate-shaped optical components (grating components) in which grating is performed. On the optical waveguide 30, the light reflecting frame 32d is provided to cover the first micro-tile shaped element 21, and the light reflecting frame 32e is provided to cover the second micro-tile shaped element 22.

Herein, when the distance between an optical waveguide 30a and an optical waveguide 30b is relatively large, as shown in FIG. 9, light reflecting frames 32e are individually attached to the optical waveguides 30a and 30b. When the optical waveguide 30a and the optical waveguide 30b are provided to be close and almost parallel to each other, as shown in FIG. 9, a light reflecting frame 32d may be attached in common to the optical waveguide 30a and the optical waveguide 30b.

In the light scattering frames and light reflecting frames illustrated in FIGS. 3 to 9, it is effective to use a combination thereof. The structures of the first to the present exemplary embodiments may be combined to implement the wavelength multiplexing on-chip optical interconnection circuit with high efficiency.

Fabricating Method

Next, a method of fabricating the optical waveguide 30 of the optical interconnection circuit according to the present exemplary embodiment will be described with reference to FIGS. 10 to 13. FIG. 10 is a schematic side view illustrating a method of fabricating the optical waveguide 30.

Figure 10A:
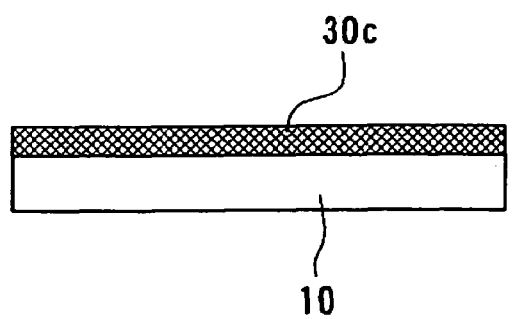
FIGS. 10(A) and 10(B) are typical side views illustrating a fabricating method according to an exemplary embodiment of the present invention.

First, the first micro-tile shaped element 21 and the second micro-tile shaped element 22 are attached to the top surface of the substrate 10. Then, a process to fabricate the optical waveguide 30 is performed. As shown in FIG. 10(a), photocurable resin 30c in a liquid state is coated over the entire top surface of the substrate 10 and the top surfaces of the first micro-tile shaped element and the second micro-tile shaped element (not shown). Such coating may be performed by a spin coating method, a roll coating method, a spray coating method, and the like.

Figure 10B:
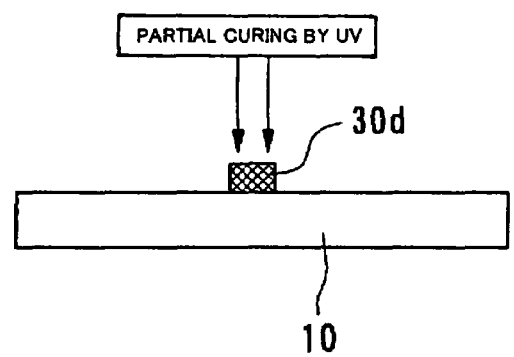

Next, UV light radiates to the liquid photo-curable resin 30c with a desired pattern mask. As a result, only the desired region of the liquid photo-curable resin 30c is hardened to be patterned. Hence, as shown in FIG. 10(b), the optical waveguide 30d made of a hardened optical waveguide material is formed by removing a region of resin not hardened.

Figure 11A:
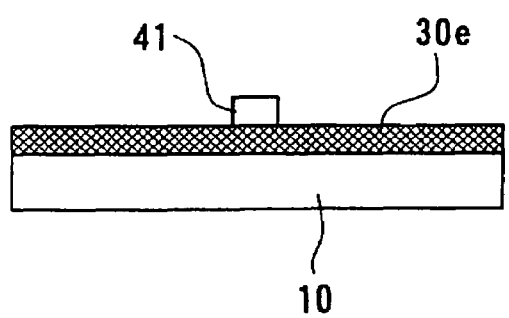
FIGS. 11(A) and 11(B) are typical side views illustrating another fabricating method according to an exemplary embodiment of the present invention.

FIG. 11 is typical side views illustrating another example of the method of fabricating the optical waveguide 30. First, the first micro-tile shaped element and the second micro-tile shaped element are attached to the top surface of the substrate 10. Then, a process to fabricate the optical waveguide 30 is performed. Then, as shown in FIG. 11(a), resin 30e is coated over the entire top surface of the substrate 10 and the top surfaces of the first micro-tile shaped element and the second micro-tile shaped element (not shown) to be hardened. Such coating may be performed by a spin coating method, a roll coating method, a spray coating method, and the like. Then, a resist mask 41 is formed at the desired region on the resin 30e. The region on which the resist mask 41 is formed is equal to a region where the optical waveguide 30 is formed.

Figure 11B:
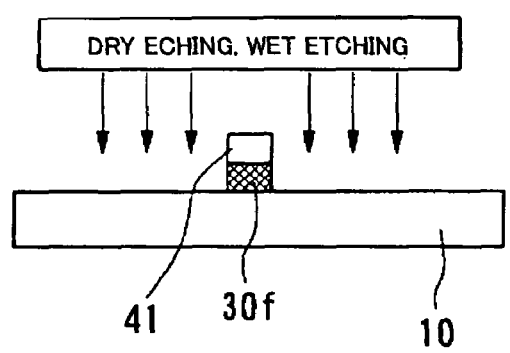

Next, as shown in FIG. 11(b), dry etching or wet etching is performed to the entire substrate 10 with the resist mask 41, and resin 30e except for a portion under the resist mask 41 is removed. The optical waveguide 30f made of an optical waveguide material is formed by removing the resist mask 41 through photolithography patterning.

Figure 12A:
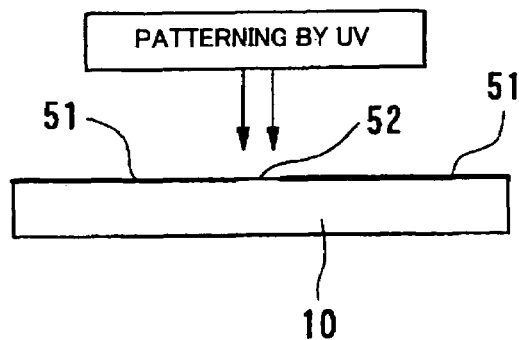
FIGS. 12(A) and 12(B) are typical side views illustrating another fabricating method according to an exemplary embodiment of the present invention.
Figure 12B:
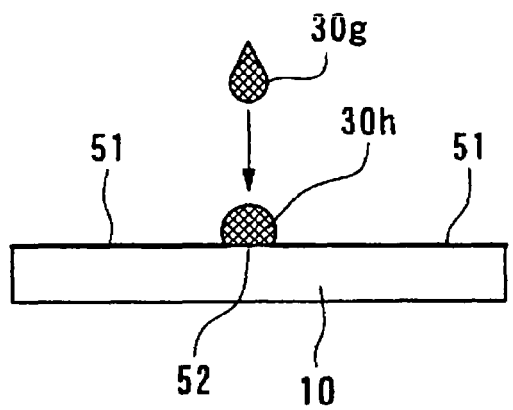

FIG. 12 is typical side views illustrating another example of the method of fabricating the optical waveguide 30. First, the first micro-tile shaped element and the second micro-tile shaped element are attached to the top surface of the substrate 10. Then, the process to fabricate the optical waveguide 30 is performed. Then, the liquid repellent treatment is performed to the entire top surface of the substrate 10 and the entire top surfaces of the first micro-tile shaped element and the second micro-tile shaped element (not shown) to provide a liquid repellent surface 51.

Next, as shown in FIG. 12(*a*), UV light radiates to the desired region of the liquid repellent surface 51, such that the desired region of the liquid repellent surface 51 can be changed into a lyophilic surface 52. Then, as shown in FIG. 12(*b*), a liquid optical waveguide material 30*g* is dropped from an inkjet nozzle, a dispenser, and the like to the lyophilic region 52. Transparent resin or sol gel solution may be used as the optical waveguide material 30*g*. Then, the optical waveguide 30*h* made of the optical waveguide material is formed by hardening the optical waveguide material 30*g* dropped on the substrate 10.

When the optical waveguide material 30*g* is made of sol gel glass, an acid is added to metal alkoxide, and then hydrolyzed solution is dropped from the inkjet nozzle or the dispenser to the lyophilic surface 52. Then, energy, such as heat, is applied to the dropped solution to make glass, thereby forming an optical waveguide 30*h*.

Figure 13A:
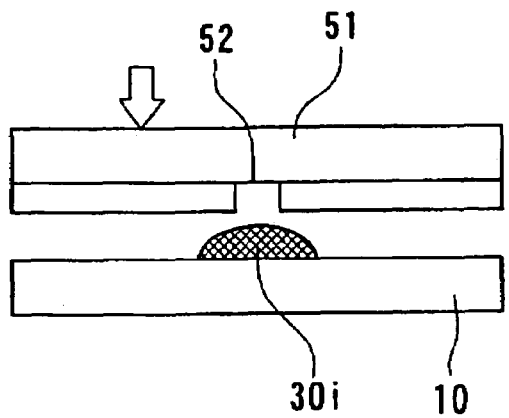
FIGS. 13(A) and 13(B) are typical side views illustrating another fabricating method according to an exemplary embodiment of the present invention.
Figure 13B:
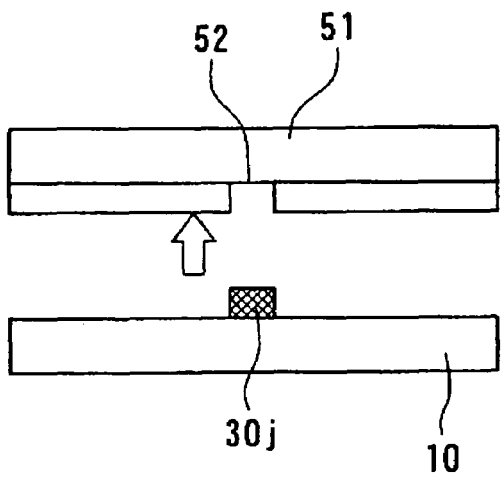

FIG. 13 is typical side views illustrating another example of the method of fabricating the optical waveguide 30. First, the first micro-tile shaped element and the second micro-tile shaped element are attached to the top surface of the substrate 10. Then, a process to fabricate the optical waveguide 30 is performed. Hence, as shown in FIG. 13(*a*), liquid resin 30*i* is applied over the top surface of the substrate 10 and the top surfaces of the first micro-tile shaped element and the second micro-tile shaped element to cover a region in which the optical waveguide 30 will be formed.

Next, a stamper 51 having a pattern shape 52 of the optical waveguide 30 is pressed into a surface of the substrate 10 from the upper part of the substrate 10. Then, as shown in FIG. 13(*b*), the stamper 51 is raised from the surface of the substrate 10. As a result, by a pattern transfer method using the stamper 51, an optical waveguide 30*j*, made of an optical waveguide material, is formed in the desired pattern on the substrate 10.

Other than the method illustrated in FIGS. 10 to 13, A method of fabricating the optical waveguide 30 described below may be used. For example, an optical waveguide material forming the optical waveguide 30 may be provided by a printing method, such as a screen printing or an offset printing. The optical waveguide material forming the optical waveguide 30 may be provided by a slit coating method in which liquid resin is discharged from gaps of a slit shape. As the slit coating method, a desired medium such as resin may be applied to the substrate 10 by a capillary phenomenon.

Method of Fabricating Micro-tile Shaped Element

Next, a method of fabricating micro-tile shaped elements including the first micro-tile shaped element 21 and the second micro-tile shaped element 22 will be described with reference to FIGS. 14 to 23. The micro-tile shaped elements of the present exemplary embodiment are fabricated by an epitaxial lift-off technique as its basis. In the present fabricating method, although a case where a compound semiconductor device (a compound semiconductor element) of the micro-tile shaped element is attached to silicon/LSI chip forming a substrate is described, the aspect of the present invention can be applied regardless of a kind of a semiconductor device or a kind of a LSI chip. In addition, although a "semiconductor substrate" in the present exemplary embodiment represents an advantage made of a semiconductor material, the "semiconductor substrate" is not limited to a plate-shaped semiconductor, but includes a semiconductor material with all kinds of shape.

Figure 14:
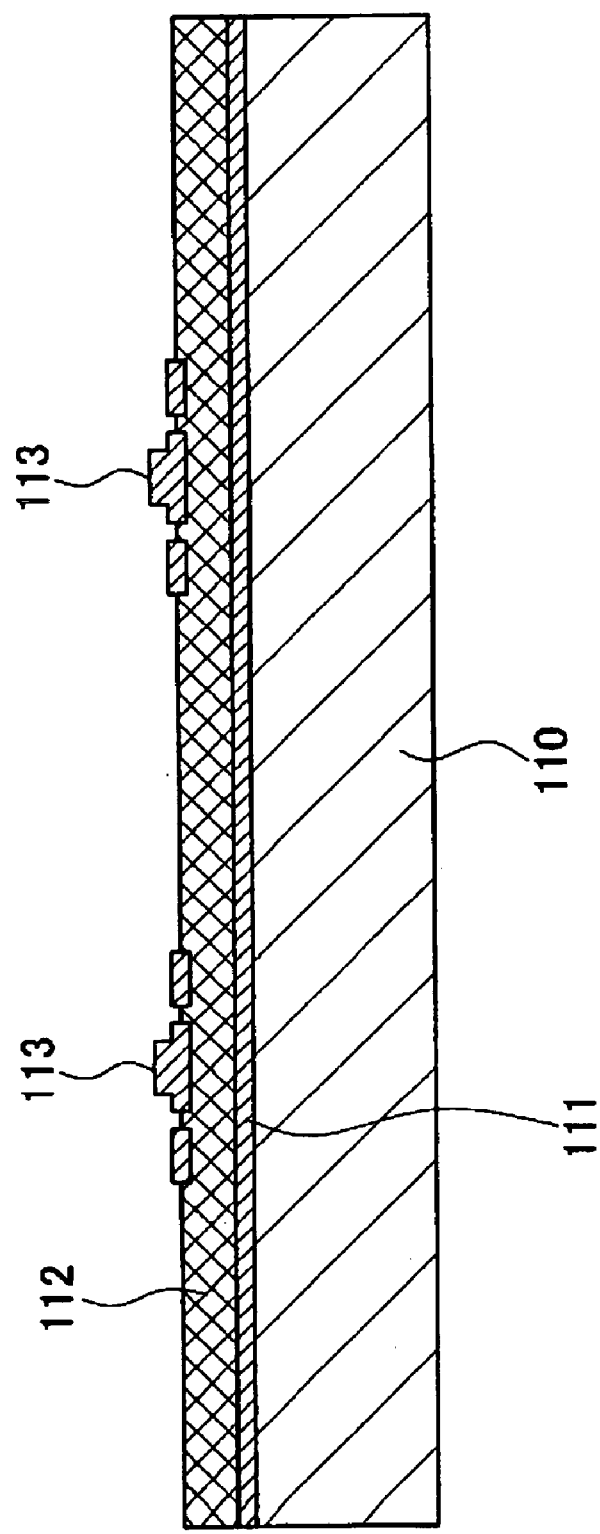
FIG. 14 is a schematic sectional view illustrating a first step of an exemplary method of fabricating a micro-tile shaped element.

FIG. 14 is a schematic sectional view illustrating a first step of an exemplary method of fabricating the micro-tile shaped element. In FIG. 14, a substrate 110 is a semiconductor substrate, e.g., a GaAs compound semiconductor substrate. A sacrifice layer 111 is provided in the lowest layer of the substrate 110. The sacrifice layer 111 is made of AlAs, and its thickness is several hundred nanometers.

For example, a function layer 112 is provided on the upper side of the sacrifice layer 111. The thickness of the function layer 112 is, for example, in the range of 1 to 10(20) micrometers. Hence, a semiconductor device (a semiconductor element) 113 is formed in the function layer 112. The semiconductor device 113 includes a light emitting diode (LED), a vertical cavity surface emitting laser (VCSEL), a photodiode (PD), a DFB laser, and the like. Such semiconductor device 113 is formed by stacking multi-epitaxial layers on the substrate 110. Further, electrodes are formed in the semiconductor device 113 for operation test.

Figure 15:
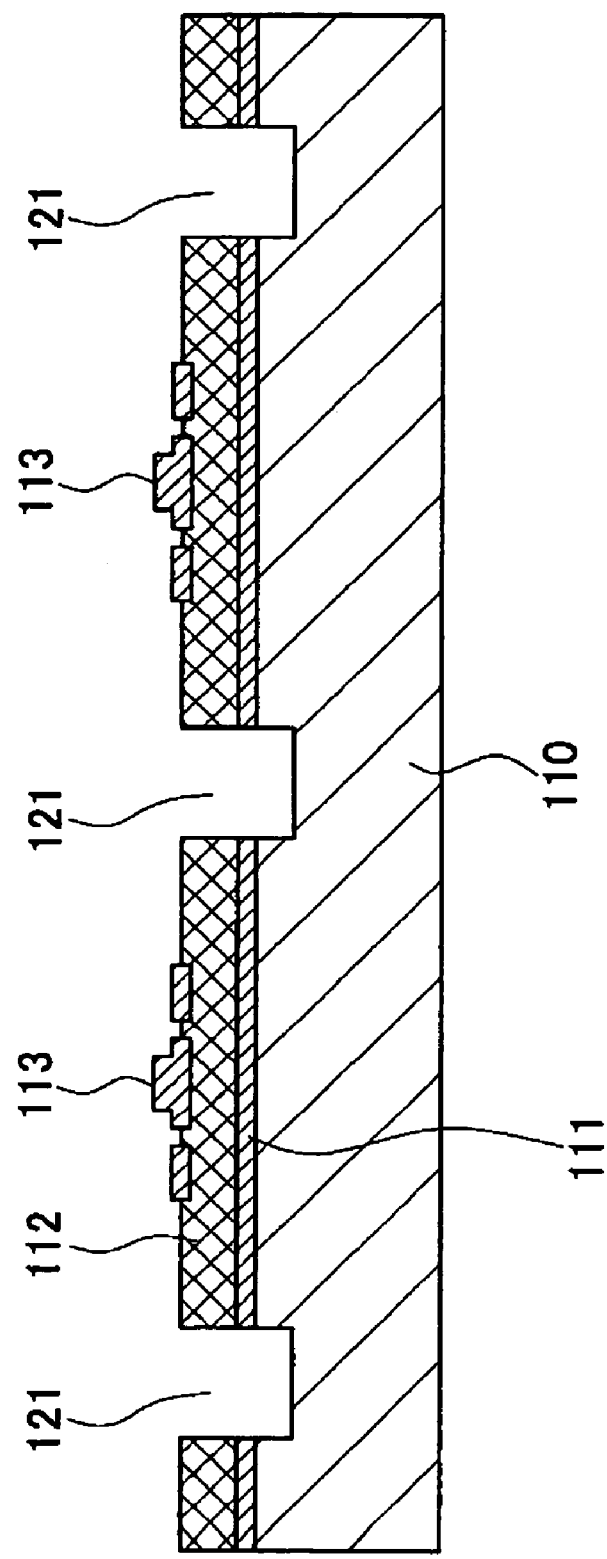
FIG. 15 is a schematic sectional view illustrating a second step of the exemplary fabricating method described above.

FIG. 15 is a schematic sectional view illustrating a second step of an exemplary method of fabricating the micro-tile shaped element. In the present step, partitioning grooves 121 are formed to partition each semiconductor device 113. The partitioning grooves 121 have the depth at least reachable to the sacrifice layer 111. For example, the width and the depth of the partitioning grooves are all in the range of several ten to several hundred micrometers. Further, the partitioning grooves 121 are formed to be connected to each other such that the selective etching solution, which will be described later, can flow in the partitioning grooves 121. Moreover, it is desirable that the partitioning grooves 121 should be formed in a lattice shape.

Further, the distance between the partitioning grooves 121 is set to be in the range of several ten to several hundred micrometers, so that each of the semiconductor device 113 defined by the partitioning grooves 121 can have an area of the range of several ten to several hundred square micrometers. As a method of fabricating the partitioning grooves 121, a photolithography method and a wet etching or a dry etching method are used. In addition, the partitioning grooves 121 may be formed using U-shaped groove dicing within a range where crack is not generated in a substrate.

Figure 16:
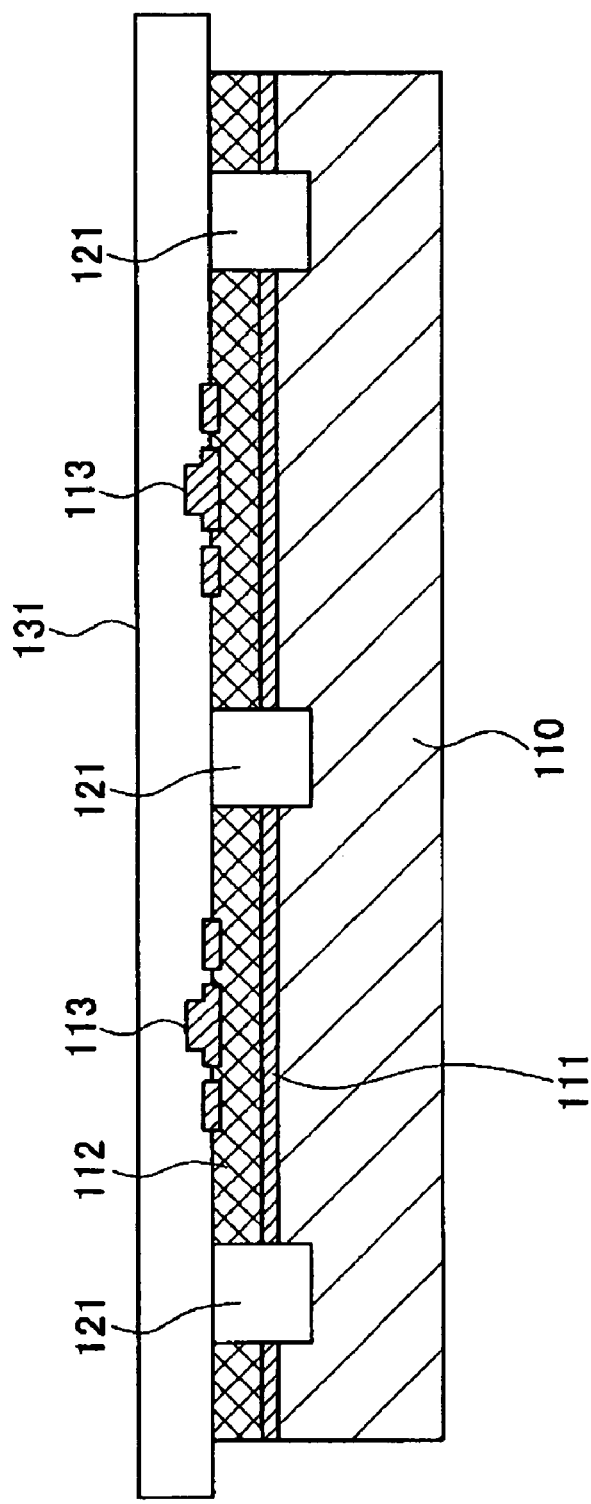
FIG. 16 is a schematic sectional view illustrating a third step of the exemplary fabricating method described above.

FIG. 16 is a schematic sectional view illustrating a third step of the method of fabricating the micro-tile shaped element. In the present step, an intermediate transfer film 131 is attached to the surface of the substrate 110 (semiconductor device 113 side). The intermediate transfer film 131 is a flexible band-shaped film with its surface coated with adhesion paste.

Figure 17:
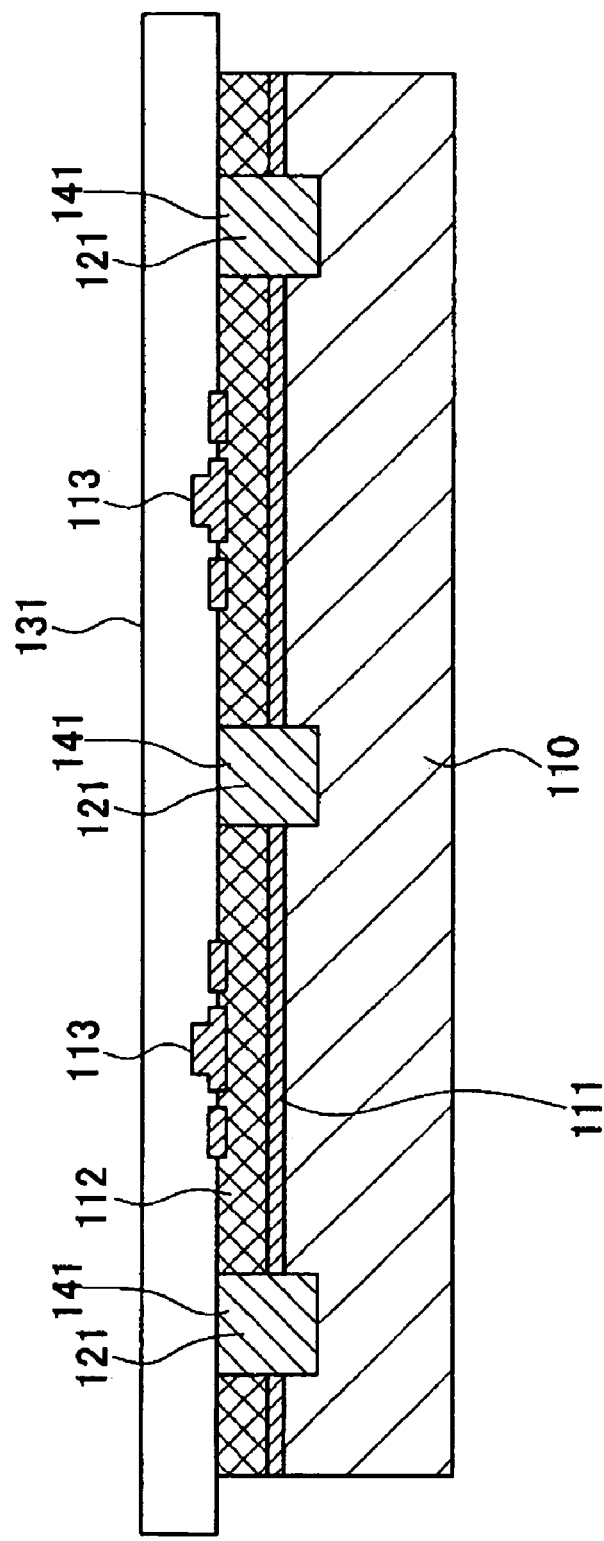
FIG. 17 is a schematic sectional view illustrating a fourth step of the exemplary fabricating method described above.

FIG. 17 is a schematic sectional view illustrating a fourth step of an exemplary method of fabricating the micro-tile shaped element. In the present step, the selective etching solution 141 is injected into partitioning grooves 121. In the present step, in order to selectively etch only the sacrifice layer 111, the hydrochloric acid of low density, which has high selectivity to aluminum/arsenic, is used as the selective etching solution 141.

Figure 18:
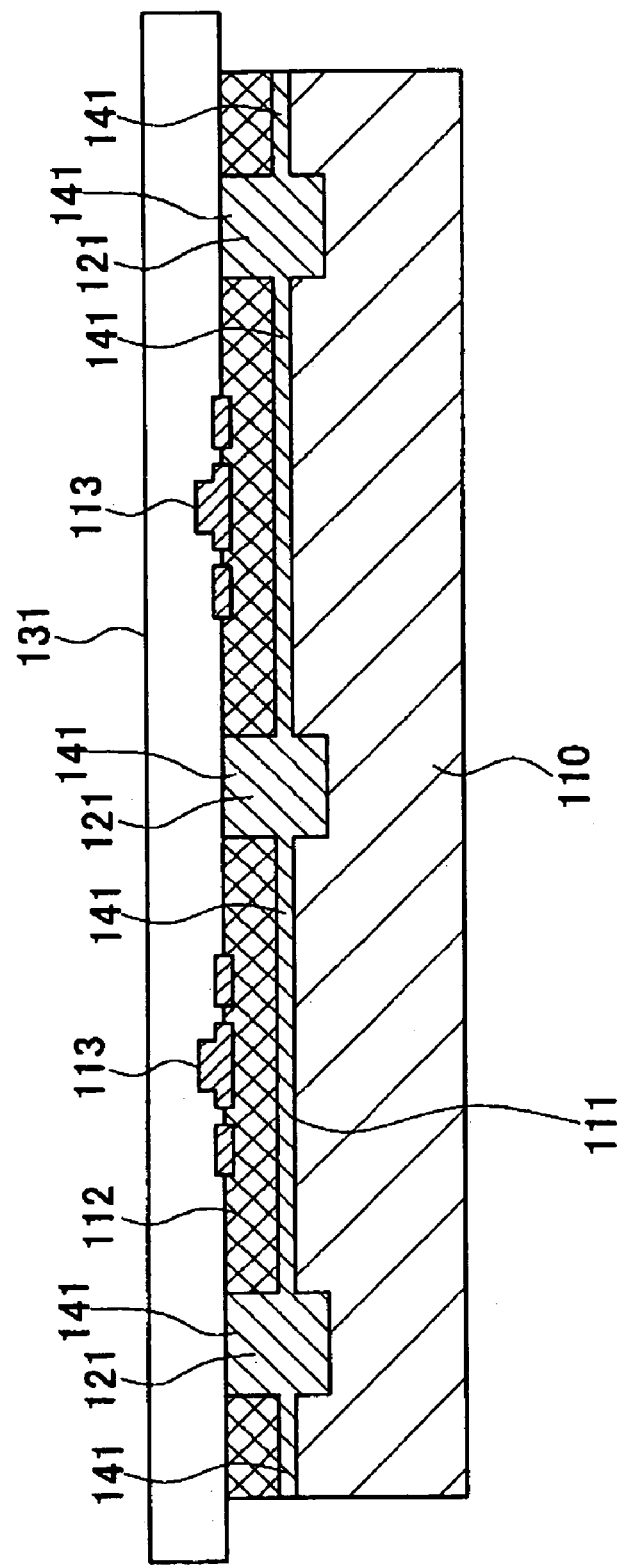
FIG. 18 is a schematic sectional view illustrating a fifth step of the exemplary fabricating method described above.

FIG. 18 is a schematic sectional view illustrating a fifth step of an exemplary method of fabricating the micro-tile shaped element. In the present step, after injecting the selective etching solution 141 into the partitioning grooves 121 in the fourth step, and then, the whole sacrifice layer 111 is selectively etched and removed from the substrate 110 with the lapse of a predetermined time.

Figure 19:
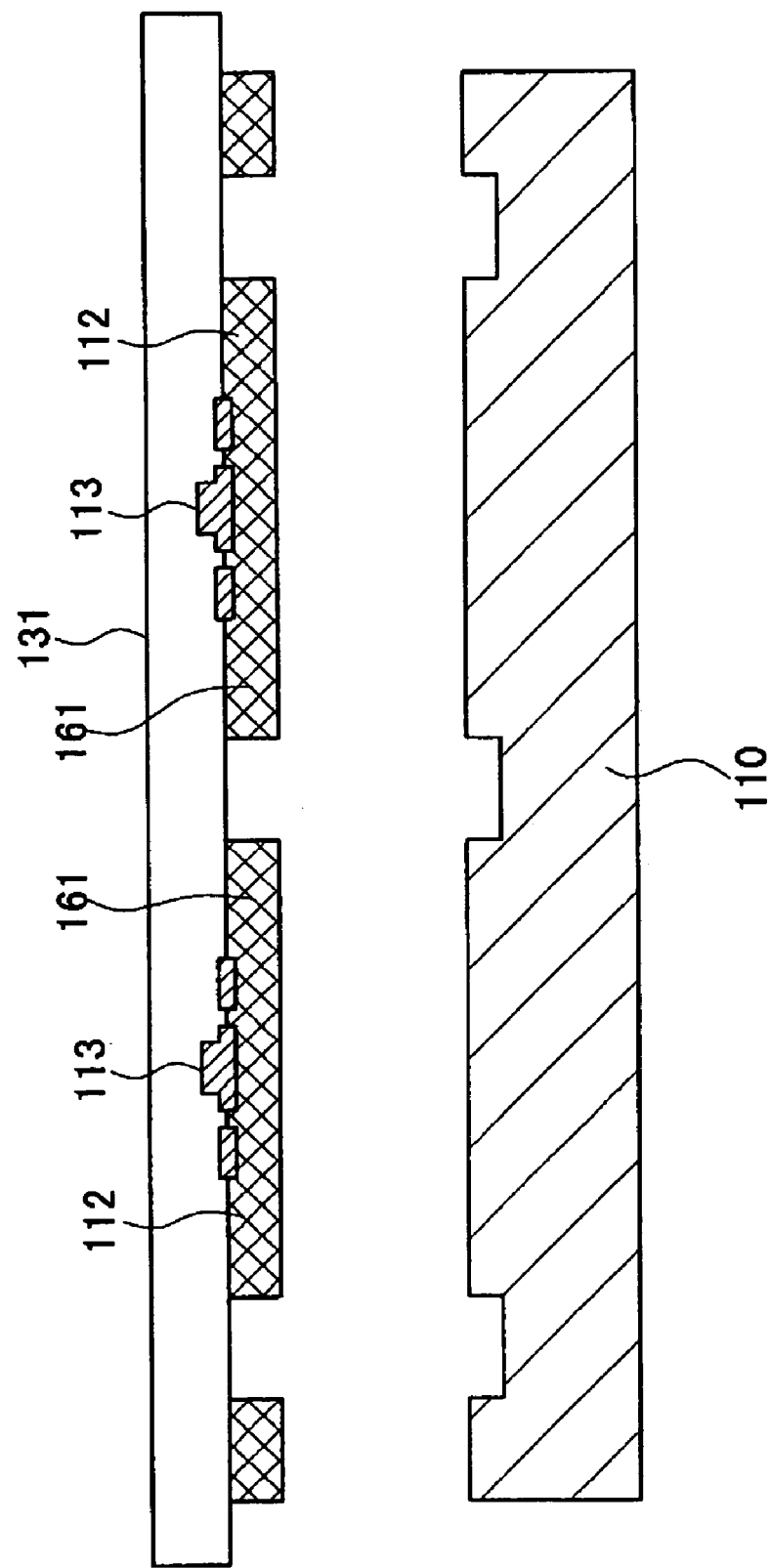
FIG. 19 is a schematic sectional view illustrating a sixth step of the exemplary fabricating method described above.

FIG. 19 is a schematic sectional view illustrating a sixth step of an exemplary method of fabricating the micro-tile shaped element. The entire sacrifice layer 111 is etched in the fifth step, and then the function layer 112 is detached from the substrate 110. Then, in the present step, the function layer 112, to which the intermediate transfer film 131 is attached, is detached from the substrate 110 by detaching the intermediate transfer film 131 from the substrate 110.

As a result, by forming the partitioning grooves 121 and etching the sacrifice layer 111, the function layer 121, in which semiconductor devices 113 are formed, is segmented to be a semiconductor device ("micro-tile shaped element" of the aforementioned exemplary embodiment) having a desired shape (e.g., micro-tile shape) and to adhere to the intermediate transfer film 131. Herein, it is desirable that the function layer should have a thickness of, for example, 1 to 8 μm and a size (height and width) of, for example, several ten to several hundred micrometers.

Figure 20:
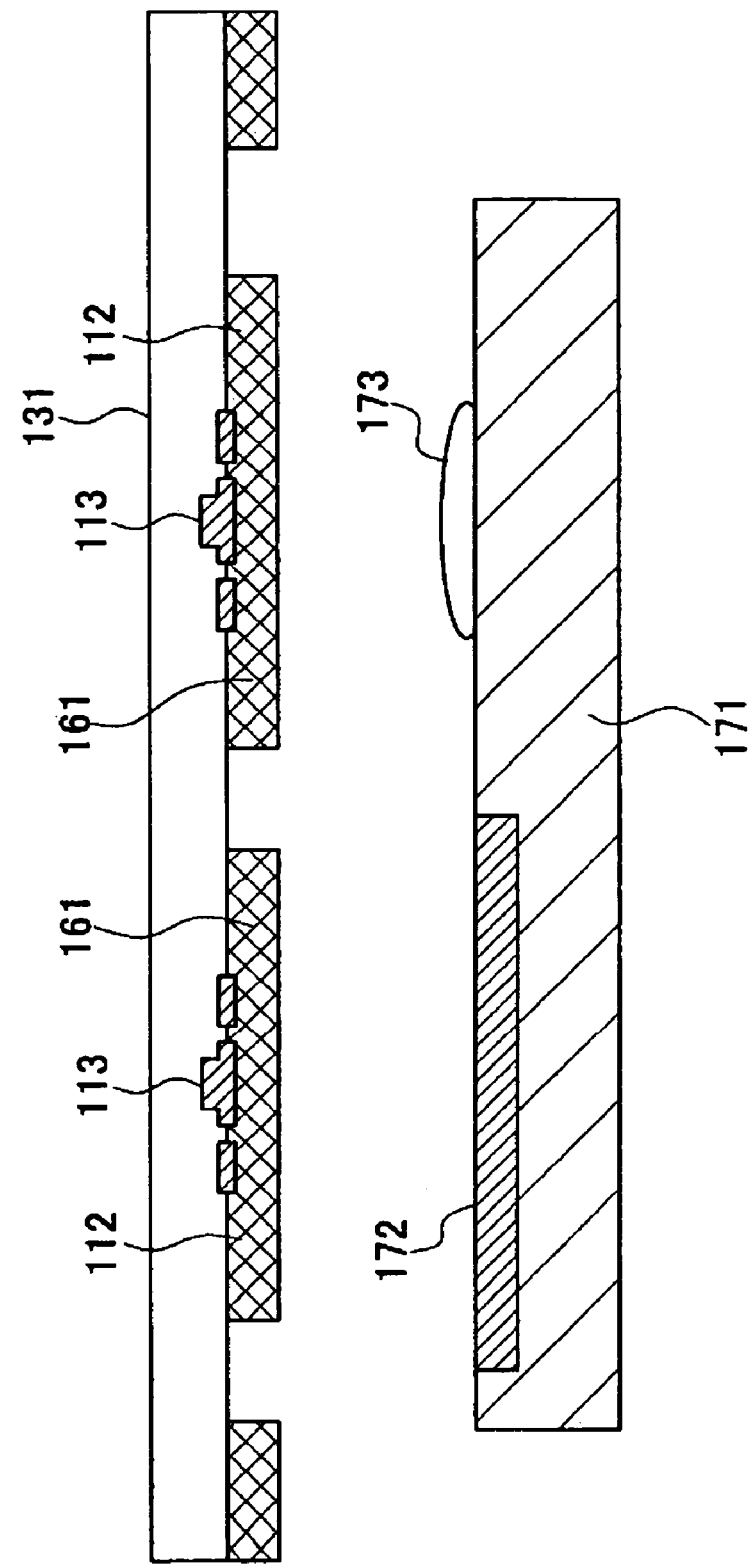
FIG. 20 is a schematic sectional view illustrating a seventh step of the exemplary fabricating method described above.

FIG. 20 is a schematic sectional view illustrating a seventh step of an exemplary method of fabricating the micro-tile shaped element. In the present step, the intermediate transfer film 131 (to which micro-tile shaped elements 161 are attached) moves to align the micro-tile shaped elements 161 at a desired region of a final substrate 171. Herein, the final substrate 171 is composed of, for example, a silicon semiconductor or an IC chip(the IC chip 10d shown in FIG. 1), and an LSI region 172(corresponding to the circuit block 240a, 240b, and 240c) is formed therein. Further, an adhesive 173 to attach the micro-tile shaped elements 161 is previously applied to a desired region on the final substrate 171.

Figure 21:
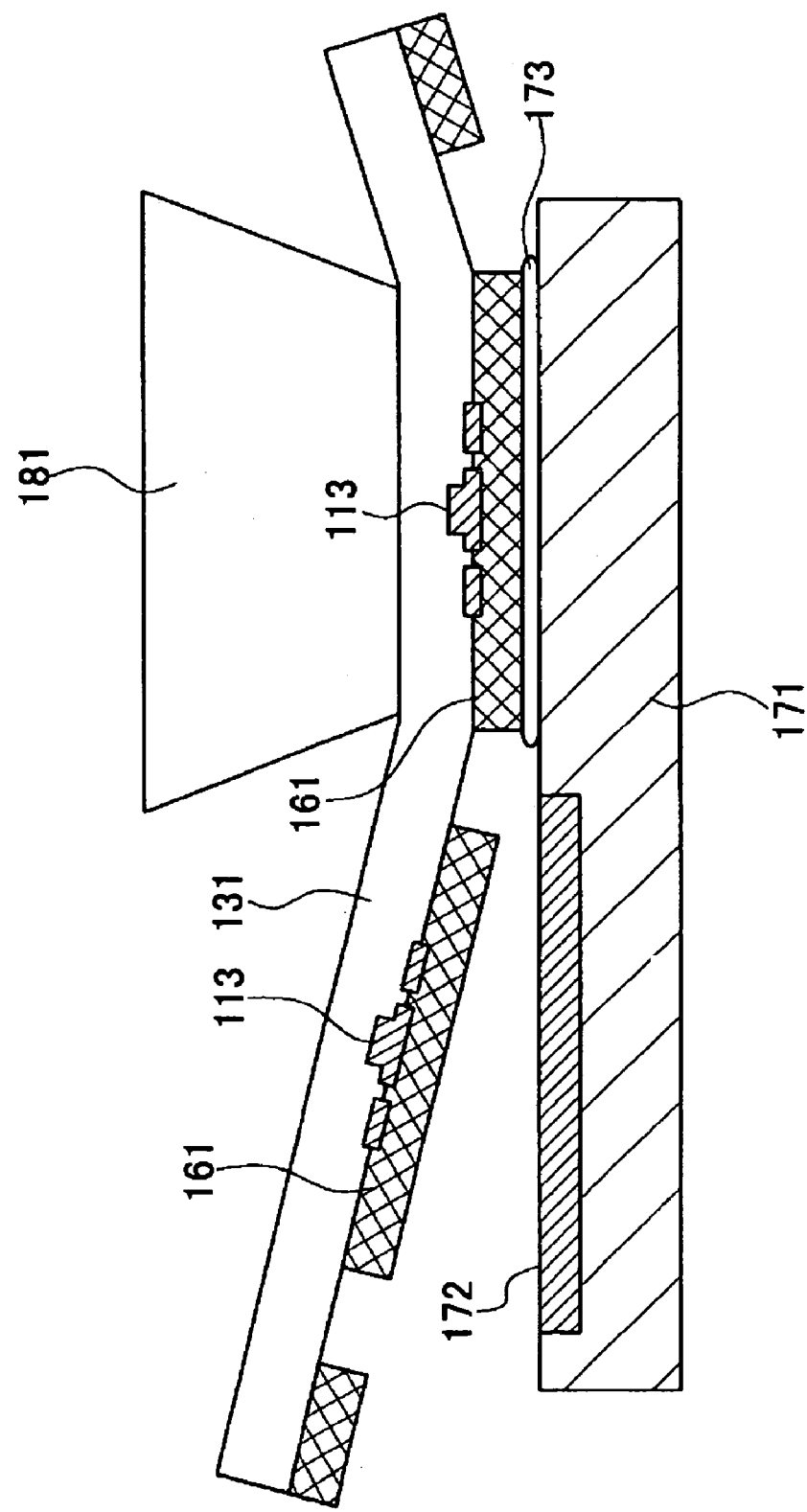
FIG. 21 is a schematic sectional view illustrating an eighth step of the exemplary fabricating method described above.

FIG. 21 is a schematic sectional view illustrating an eighth step of an exemplary method of fabricating the micro-tile shaped element. In the present step, micro-tile shaped elements 161, which are aligned to the desired portion of the final substrate 171, are pressed by a back pressing pin 181 with the intermediate transfer film 131, thereby adhering to the final substrate 171. Herein, because the adhesive 173 is applied to the desired portion, the micro-tile shaped elements 161 are attached to the desired portion of the final substrate 171.

Figure 22:
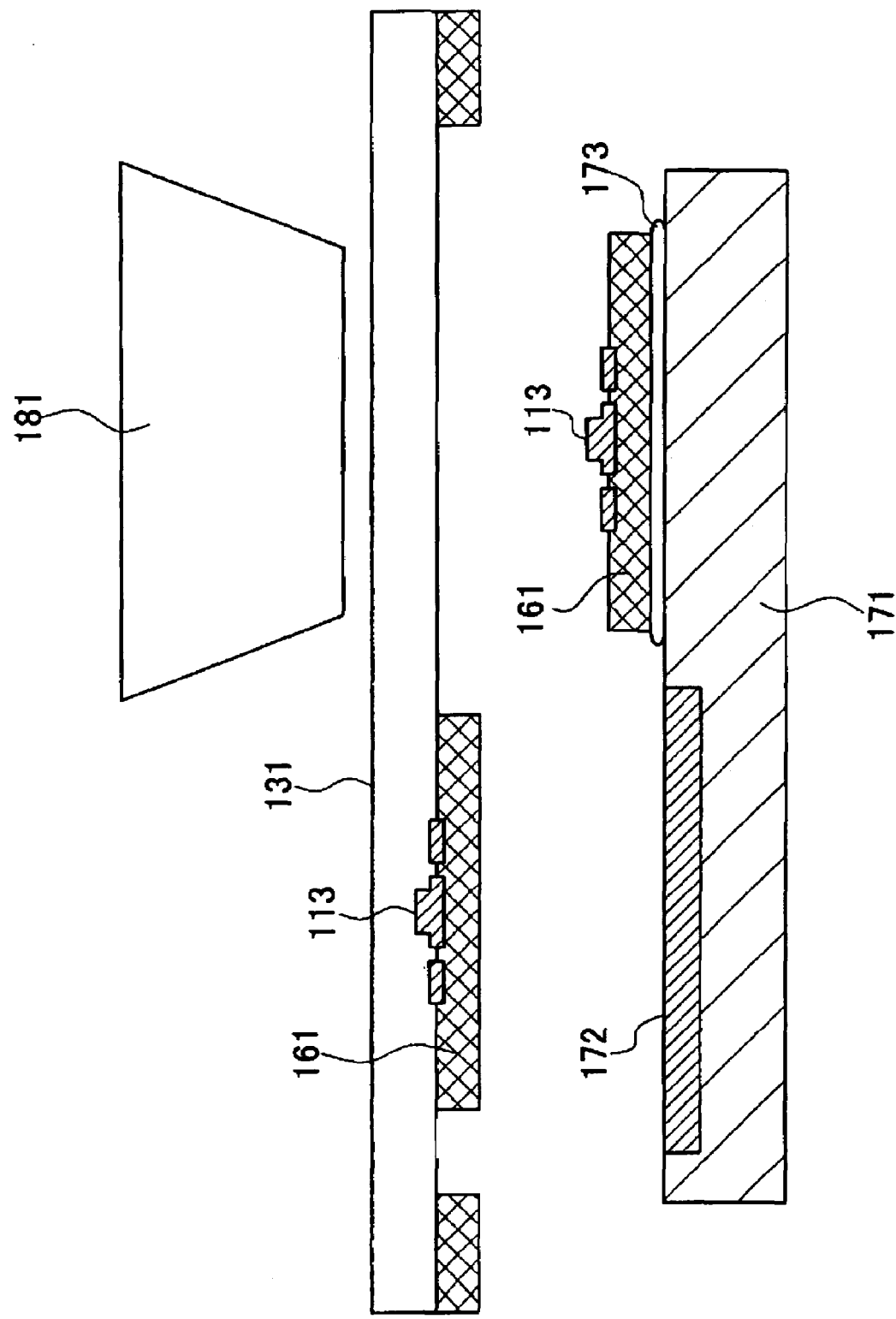
FIG. 22 is a schematic sectional view illustrating a ninth step of the exemplary fabricating method described above.

FIG. 22 is a schematic sectional view illustrating a ninth step of an exemplary method of fabricating the micro-tile shaped element. In the present step, the intermediate transfer film 131 is detached from the micro-tile shaped elements 161 by vanishing the adhesion of the intermediate transfer film 131.

The adhesion of an adhesive for the intermediate transfer film 131 is vanished by UV light or heat. When using an adhesive having UV curable characteristics, the pin 181 is made of a transparent material, and UV light radiates from the front end of the pin 181, so the adhesion of the intermediate transfer film 131 is vanished. When using an adhesive having thermosetting characteristics, the pin 181 may be heated. Alternatively, after the sixth step, UV light may radiate to the entire surface of the intermediate transfer film 131 to vanish the adhesiveness completely. Although the adhesion is vanished, adhesiveness is substantially remained a little, and the micro-tile shaped elements 161 are very thin and light. Thus, the micro-tile shaped elements 161 are attached to the intermediate transfer film 131.

The present step is not shown. In the present step, the micro-tile shaped elements 161 are attached to the final substrate 171 by a thermal processing.

Figure 23:
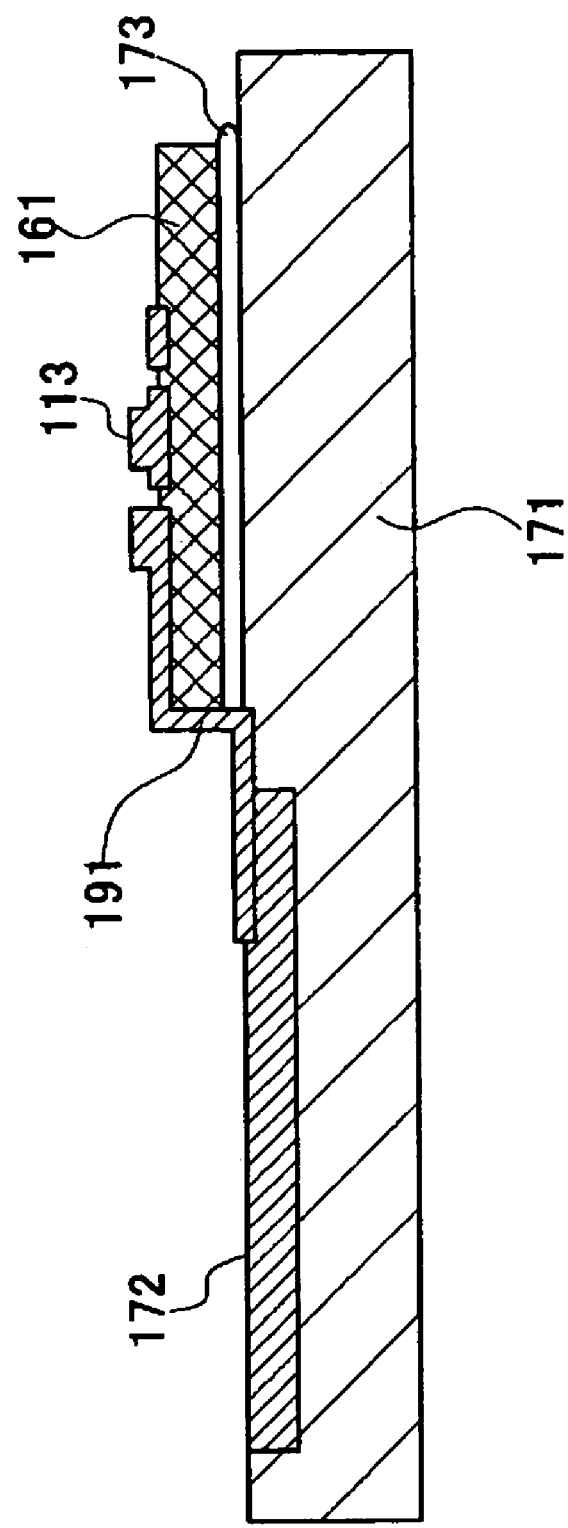
FIG. 23 is a schematic sectional view illustrating an eleventh step of the exemplary fabricating method described above.

FIG. 23 is a schematic sectional view illustrating an eleventh step of an exemplary method of fabricating the micro-tile shaped element. In the present step, an electrode of the micro-tile shaped element 161 is electrically connected through wiring 191 to circuits on the final substrate 171 to form one LSI chip (an integrated circuit chip for an optical interconnection circuit). A quartz substrate or a plastic film as well as a silicon semiconductor may be used as the final substrate 171.

Example of Application

Hereinafter, an example of the application of the optical interconnection circuit according to an aspect of the present invention will be described.

For example, the wavelength multiplexing on-chip optical interconnection circuits of the above-described exemplary embodiments are used as signal transmission device of an optoelectronics integrated circuit system. A computer is used as the optoelectronics integrated circuit system. Next, integrated circuits constituting a CPU are formed on the substrate 10, and integrated circuits constituting a storage device are formed on the substrate 10. Although signal processing in the integrated circuits constituting the CPU or the storage device is performed using electrical signals, the wavelength multiplexing on-chip optical interconnection circuit of the above-described exemplary embodiment is applied to the data transmission line between such circuit blocks.

As a result, in accordance with the present application in simple and easy configuration, it is possible to greatly enhance the signal transmission speed of bus, which has become bottleneck in a computer processing speed, as compared with the related art. Further, according to the present application, it is possible to make thinner and to miniaturize such computer system in a large range.

Electronic Apparatus

An electronic apparatus having a flat panel display or a wavelength multiplexing on-chip optical interconnection circuit of the above-described exemplary embodiments will be described.

Figure 24:
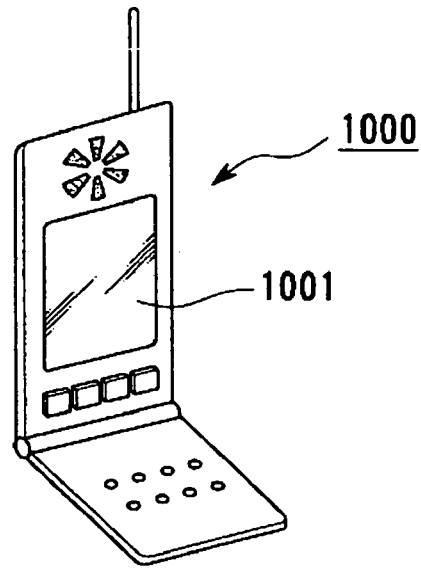
FIG. 24 is a schematic illustrating an example of an electronic apparatus including the circuit according to the present exemplary embodiment.

FIG. 24 is a perspective view illustrating an example of a cellular phone. In FIG. 24, reference numeral 1000 represents a body of a cellular phone using the above-described wavelength multiplexing on-chip optical interconnection circuit, and reference numeral 1001 represents a display part using the above-described flat panel display (an electro-optical device).

Figure 25:
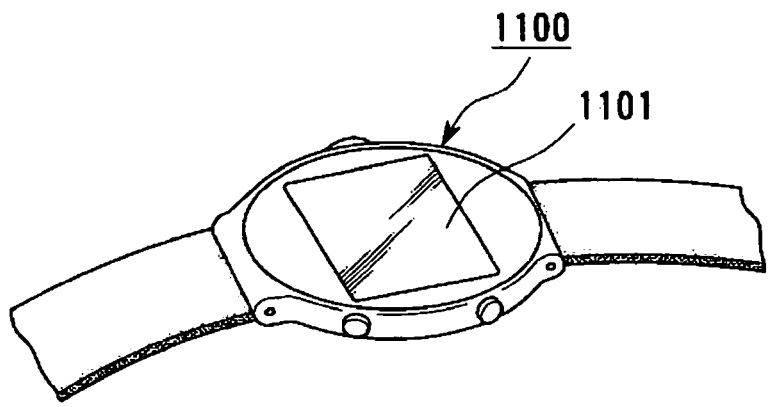
FIG. 25 is a schematic illustrating an example of an electronic apparatus including the circuit according to the present exemplary embodiment.

FIG. 25 is a perspective view illustrating an example of a wristwatch type electro-optical apparatus. In FIG. 25, reference numeral 1100 represents a body of a watch using the above-described wavelength multiplexing on-chip optical interconnection circuit, and reference numeral 1101 represents a display part using the above-described flat panel display (an electro-optical device).

Figure 26:
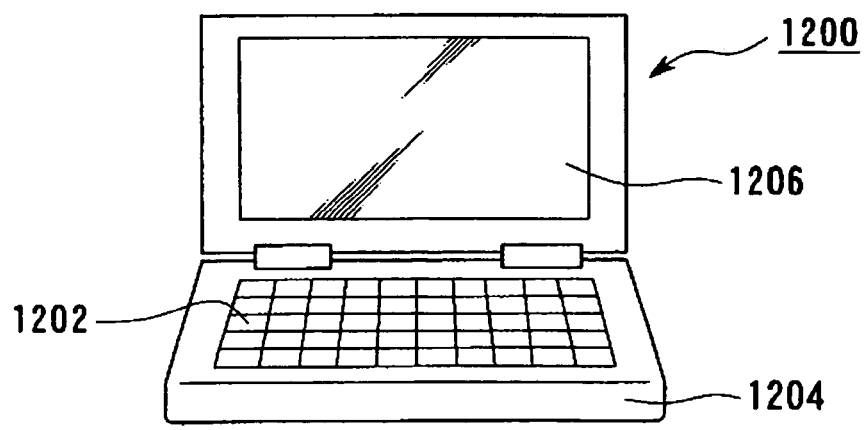
FIG. 26 is a schematic illustrating an example of an electronic apparatus including the circuit according to the present exemplary embodiment.

FIG. 26 is a perspective view illustrating an example of a portable information processing device, such as a word-processor or PC. In FIG. 26, reference numeral 1200 represents an information processing device, reference numeral 1202 represents an input part, such as a keyboard, reference numeral 1204 represents a body of the information processing device using the above-described wavelength multiplexing on-chip optical interconnection circuit, and reference numeral 1206 represents a display part using the above-described flat panel display (an electro-optical device).

Since the electronic apparatus shown in FIGS. 24 to 26 have the above-described wavelength multiplexing on-chip optical interconnection circuit or the above-described flat panel display, it is possible to achieve an electronic apparatus having a display part with a high display quality, high response speed, and the bright and large screen. Further, as compared with the related art, it is possible to achieve a thin and small electronic apparatus using the above-described on-chip optical interconnection circuit. Moreover, it is possible to reduce the sizes and manufacturing costs using the above-described wavelength multiplexing on-chip optical interconnection circuit.

Further, the scope of the invention is not limited to the above-described exemplary embodiments, and various modifications can be made without departing from the spirit or scope of the present invention. It is also intended that specific materials or configurations illustrated in the exemplary embodiments are only examples and suitable modifications can be made.

What is claimed is:

1. An optical interconnection circuit, comprising:
an integrated circuit chip;
a first circuit block provided on the integrated circuit chip, the first circuit block including a first element emitting a first light and a second element emitting a second light;
a second circuit block provided on the integrated circuit chip, the second circuit block including a third element receiving the first light and a fourth element receiving a second light;
a first optical waveguide that is provided on the integrated circuit chip, the first optical waveguide optically connecting the first and the third elements;
a second optical waveguide that is provided on the integrated circuit chip, the second optical waveguide optically connecting the second and the fourth elements;
a common light reflecting frame that reflects the first light and the second light; and
a wavelength of the first light emitted by the first element being different from a wavelength of the second light emitted by the second elements,
the first circuit block and the second circuit block being optically and electrically connected to each other.

2. The optical interconnection circuit according to claim 1,
at least a part of the first optical waveguide and the second optical waveguide being provided on top surfaces of the first circuit block and the second circuit block.

3. The optical interconnection circuit according to claim 1,
at least a part of the first optical waveguide being provided on the first circuit block and the second circuit block to traverse the first circuit block and the second circuit block.

4. The optical interconnection circuit according to claim 1,
at least a part of the first optical waveguide being provided to detour around a third circuit block.

5. The optical interconnection circuit according to claim 1,
the first and the second elements being electrically connected to the first circuit block, and
the third and the fourth elements being electrically connected to the second circuit block.

6. The optical interconnection circuit according to claim 1,
at least a part of the first optical waveguide covering at least the first element and the third element, and at least part of the second optical waveguide covering at least part of the second element and the fourth element.

7. The optical interconnection circuit according to claim 1,
the first circuit block and the second circuit block being any one of a CPU, a memory circuit, a DSP, an RF amplifying circuit, an image sensor, and a bio sensor, and
the first optical waveguide and the second optical waveguide being a transmission line of data signals or clock signals.

8. The optical interconnection circuit according to claim 1,
a plurality of the integrated circuit chips being mounted on a substrate, and
the plurality of integrated circuit chips being optically connected to each other at least through the first element and the third element and the first optical waveguide provided on the substrate.

9. The optical interconnection circuit according to claim 1,
a plurality of the integrated circuit chips being mounted on a substrate,
the integrated circuit chips being tightly bonded to each other, and
the integrated circuit chips being optically or electrically connected to each other.

10. An electro-optical device, comprising:
the optical interconnection circuit according to claim 1.

11. An electronic apparatus, comprising:
the optical interconnection circuit according to claim 1.

12. The optical interconnection circuit according to claim 1,
the common light reflecting frame reflecting the first light and the second light so that the first light and the second light enters the first optical waveguide and the second optical waveguide, respectively.

13. An optical interconnection circuit, comprising:
an integrated circuit chip;
a first circuit block provided on the integrated circuit chip, the first circuit block including a first element emitting a first light and a second element emitting a second light;
a second circuit block provided on the integrated circuit chip, the second circuit block including a third element receiving the first light and a fourth element receiving a second light;
a first optical waveguide that is provided on the integrated circuit chip, the first optical waveguide optically connecting the first and the third elements;
a second optical waveguide that is provided on the integrated circuit chip, the second optical waveguide optically connecting the second and the fourth elements;
a common light reflecting frame that reflects the first light and the second light; and
a wavelength of the first light emitted by the first element being different from a wavelength of the second light emitted by the second element, wherein
at least a part of the first optical waveguide is provided to detour around a third circuit block.

* * * * *